US 6,714,477 B2

(12) United States Patent
Nakayama et al.

(10) Patent No.: US 6,714,477 B2
(45) Date of Patent: Mar. 30, 2004

(54) SEMICONDUCTOR INTEGRATED CIRCUIT DEVICE WITH MEMORY BLOCKS AND A WRITE BUFFER CAPABLE OF STORING WRITE DATA FROM AN EXTERNAL INTERFACE

(75) Inventors: Michiaki Nakayama, Ome (JP); Hideki Sakakibara, Ome (JP); Toru Kobayashi, Iruma (JP); Shuichi Miyaoka, Hannou (JP); Yuji Yokoyama, Ome (JP); Hideo Sawamoto, Machida (JP); Masaji Kume, Ebina (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/187,947

(22) Filed: Jul. 3, 2002

(65) Prior Publication Data

US 2002/0176308 A1 Nov. 28, 2002

Related U.S. Application Data

(62) Division of application No. 09/775,544, filed on Feb. 5, 2001, now Pat. No. 6,430,103.

(30) Foreign Application Priority Data

Feb. 3, 2000 (JP) ........................................ 2000-032636

(51) Int. Cl.[7] .............................. G11C 8/00; G11C 7/00
(52) U.S. Cl. ................................. 365/230.03; 365/222
(58) Field of Search ....................... 365/230.03, 189.05, 365/220, 221, 230.01, 230.05, 230.08, 222, 233, 189.03

(56) References Cited

U.S. PATENT DOCUMENTS

| 5,379,394 | A | * | 1/1995 | Goto ........................... 710/305 |
| 6,167,509 | A | * | 12/2000 | Sites et al. ................... 712/237 |
| 6,415,353 | B1 | * | 7/2002 | Leung ......................... 365/222 |
| 6,430,103 | B2 | * | 8/2002 | Nakayama et al. .... 365/230.03 |
| 2001/0007538 | A1 | * | 7/2001 | Leung ......................... 365/222 |

FOREIGN PATENT DOCUMENTS

| JP | 2-297791 | 12/1990 |
| JP | 6-195261 | 7/1994 |

* cited by examiner

*Primary Examiner*—Thong Q. Le
(74) *Attorney, Agent, or Firm*—Antonelli, Terry, Stout & Kraus, LLP

(57) ABSTRACT

Read buffers (RB0–RB3) are capable of holding data read out from a plurality of memory blocks (BNK0–BNK7) that are capable of parallel operation in response to a state in which the read data cannot be externally outputted from an external interface means; and, selection means (40, 41, 42) are provided for selecting data read out from one of the memory blocks, or data read out from one of the read buffers, and for feeding it to the external interface means, while the external-output-incapable state is not present. In this way, when there is a possibility that an output of read data will cause a resource competition, this read data is stored in a read buffer, and when there is no such possibility, then the read data can be externally outputted directly, thereby improving the throughput of read data output operations.

5 Claims, 15 Drawing Sheets

SEMICONDUCTOR INTEGRATED CIRCUIT DEVICE WITH MEMORY BLOCKS AND A WRITE BUFFER CAPABLE OF STORING WRITE DATA FROM AN EXTERNAL INTERFACE

This is a divisional of parent application Ser. No. 09/775,544, filed Feb. 5, 2001 now U.S. Pat. No. 6,430,103 the entire disclosure of which is hereby incorporated by reference.

BACKGROUND OF THE INVENTION

The present invention relates to a semiconductor integrated circuit having memory blocks; and, the invention relates more particularly to a technique for improving the throughput of a data read operation invoked in response to a read access request, which is useful for the application to a semiconductor integrated circuit used as a cache memory, including DRAMs mounted along with logic circuits.

A memory hierarchy of a storage device, when viewed in terms of the temporal and spatial locality of an information reference, typically comprises memories of a plurality of levels having different access speeds and capacities. Typically, a main memory is provided in the form of a DRAM (Dynamic Random Access Memory) having a low per-bit cost; and, in a memory level closer to the processor or CPU (Central Processing unit), there is a cache memory comprising a SRAM (Static Random Access Memory), or the like. A cache memory is a memory for holding data that has been temporally or spatially localized for data recently used by the processor to provide an improved throughput that is better than the throughput of a data read action obtained from a lower level memory.

After the completion of the present invention, the inventor of the present invention became aware of the presence of Japanese laid-open patents JP-A-2-297791 and JP-A-6-195261. The descriptions provided in these specifications are directed to a dynamic-type memory (DRAM) and a static-type memory (SRAM) on a single chip semiconductor substrate, and to the use of the DRAM and SRAM together as a cache memory. However, the objects and the configuration thereof are not described in those specifications.

SUMMARY OF THE INVENTION

The present inventor considered the possibility of mounting a large number of DRAM modules having a relatively low access speed along with logic circuits, and using the arrangement as a cache memory. The discussion included for example, a semiconductor integrated circuit-mounted with DRAM modules, which can be used as a level 3 (L3) cache memory for a microprocessor to which level 1 (L1) and level 2 (L2) cache memories are built in.

According to the investigation by the present inventor, when an attempt is made to reduce an apparent memory read cycle by mounting a large number of DRAM modules together and making them capable of parallel operation, consideration has to be given to providing some way of preventing competition among data output actions caused by the parallel operation. In such a case, when a data buffer is employed in order to prevent data competition, it has been found that it is inefficient in performing data buffering where there is no data competition.

When the data processing efficiency of a processor is considered, the most significant object would be the improvement in the throughput of read operations invoked in response to a read access by the processor. Here, a read operation of a cache memory may sometimes involve a copy-back operation (or write-back) necessitated by a write access by the processor, and such a read operation would not be required to have a high throughput in most cases. That is so because the copy-back operation is an operation for accommodating data into a main memory for replacing a dirty cache line in the case of a cache miss. Accordingly, it has been found by the present inventor that, when considering the use of the invention as a cache memory, it is necessary to avoid an excessive expansion of the logic scale of the logic circuitry differentially weighting the importance of the improvement in the throughputs of read data according to the purposes of the read data.

For a write access by a processor, there is not much significance in accelerating a write operation which has occurred in response to a write access request; however, when the data processing efficiency of the processor is of concern, it is necessary to allow the processor to be released from the write operation within a short period of time after the reception of the write access request. Especially, in the case of a DRAM, a refreshing action of the stored data is required at every refreshing interval, and the reception of the write access request should not be delayed by such a refreshing action.

An object of the present invention is to provide a semiconductor integrated circuit having a configuration in which data buffers are employed for avoiding data competition caused by the parallel operation of plural memory blocks thereby improving the throughput of read operations.

Another object of the present invention is to provide a semiconductor integrated circuit which can improve the throughput of read operations without entailing excessive expansion in the logic scale of its logic circuitry.

Still another object of the present invention is to provide a semiconductor integrated circuit which can readily accept write access requests regardless of the internal memory operation state.

The above and further objects and novel features of present invention will be more clearly understood by reading the detailed description of the present invention in conjunction with the attached figures.

The following briefly sets forth a summary of representative embodiments of the present invention among those covered herein.

[1] In order to avoid data competition caused by the parallel operation of plural memory blocks, read buffers are employed to improve the throughput of read operations. To this end, a semiconductor integrated circuit has a configuration comprising a plurality of memory blocks (BNK0–BNK7) capable of parallel operation, an external interface means (I/F1) capable of externally inputting write data and externally outputting read data, read buffers (RB0–RB3), each capable of retaining read data read out from a memory block in response to an external output-incapable state in which the read data cannot be externally outputted from the external interface means, and selecting means for selecting either read data read out from a memory block or read data read out from a read buffer and for feeding it to the external interface means, while the external output-incapable state is not present.

According to the above configuration, if a read operation is performed from one of the memory blocks that are capable of parallel operation while read data from another memory block is being externally outputted from the external interface means, this read data would cause a resource competition at the point of its external output, so that it is temporarily stored in a read buffer, and then the read data is enabled for external output from the read buffer after the prior data outputting action terminates. Therefore, even if there is a read access request that would cause resource competition during the read data output operation, a read operation may be started without having the later request wait, and this read data may be externally outputted as soon as the risk of the resource competition is resolved; thus, the throughput of the read data outputting operations may be improved.

If there is no resource competition when data is read out from a memory block, the read data is externally outputted directly from the external interface means without the intervention of a read buffer, so that useless temporary buffering of the data may be avoided when there is no data competition; and, in this point, the present invention contributes to the improvement in the throughput of the read data outputting operations.

A read buffer may be constituted by a memory having a smaller capacity and a higher speed than that of the memory blocks. For example, when the memory blocks are formed by DRAM modules, then the read buffers may be constituted by SRAM modules.

When the above configuration is viewed in terms of control, the semiconductor integrated circuit comprises a plurality of memory blocks (BNK0–BNK7) capable of parallel operation, read buffers (RB0–RB3) capable of holding read data read out from the aforementioned memory blocks, an external interface means (I/F1) capable of externally outputting the read data outputted from the read buffers or the read data outputted from the memory blocks, and a controlling means (MCNT) to control the read buffers to hold the read data in response to an external-output-incapable state, in which the read data read out from the memory block cannot be externally outputted from the external interface means, and to control either the read data read out from the memory block or the read data read out from the read buffer to be outputted from the external interface means when the above output-incapable state is resolved.

(2) In order to allow the reception of an external write access request regardless of the internal memory operation state, the semiconductor integrated circuit comprises a plurality of memory blocks (BNK0–BNK7) capable of parallel operation, an external interface means (I/F1) capable of externally inputting write data, and write buffers (WB0–WB3) for receiving and holding the write data inputted to the external interface means, and for supplying the write data to the memory blocks after the memory blocks are write-enabled.

During the internal operation of a memory block, such as the refreshing of stored data or a data read operation etc., even if there is a write access request thereto, the write data may be buffered into a write buffer beforehand, so that the processor attempting the write access can be released from the write access operation within a short period of time. Where the data processing efficiency by a processor etc. is concerned, the acceleration of the speed of write processing on the memory side in response to that write access is not so important; however, the above feature contributes to the improvement in the data processing efficiency of the whole system, since it does not hold the write access request by the processor waiting.

A write buffer may be formed by a memory etc. having a smaller capacity and higher speed than that of the memory blocks; and, in a similar manner as the prior case, when the memory blocks are formed by, for example, DRAM modules, then the write buffers may be formed by SRAM modules.

When the above configuration is viewed in terms of control, the semiconductor integrated circuit comprises an external interface means (I/F1) capable of externally inputting write data, write buffers (WB0–WB3) for receiving the write data inputted to the external interface means, a plurality of memory blocks (BNK0–BNK7) to which the write data is supplied from the write buffers, and controlling means (MCNT) to control the write buffer to store the write data supplied to the external interface means in response to an external access request, and to have the write data from the write buffer supplied to a memory block once that target memory block is write-enabled.

[3] A semiconductor integrated circuit having a combined configuration of both read and write buffers comprises a plurality of memory blocks (BNK0–BNK7) capable of parallel operation, an external interface means (I/F1) capable of externally inputting write data and externally outputting read data, write buffers (WB0–WB3) for receiving and holding the write data inputted to the external interface means and for supplying the write data to the respective memory blocks after the memory blocks are write-enabled, read buffers (RB0–RB3) capable of holding read data read out from the memory blocks in response to an external-output-incapable competition state in which the data cannot be externally outputted from the external interface means, and selection means for selecting either read data read out from a memory block or read data read out from a read buffer and for feeding it to the external interface means.

[4] An application as a cache memory connectable to both the lower level and higher level of the memory hierarchy is assumed. In this case, a semiconductor integrated circuit comprises a plurality of memory blocks (BNK0–BNK7) capable of parallel operation, a first external interface means (I/F1) capable of externally inputting write data and externally outputting read data, and a second external interface means (I/F2) capable of externally inputting write data and externally outputting read data. Furthermore, the semiconductor integrated circuit also comprises write buffers (WB0–WB3) for receiving and holding the write data inputted to the first or second external interface means and for supplying the write data to the respective memory blocks after the memory blocks are write-enabled, read buffers (RB0–RB3) for holding the read data to be outputted from the second external interface and the read data to be outputted from the first external interface means, which is in competition so that it cannot be outputted from the first external interface, and selection means for selecting either read data read out from a memory block or the read data read out from the read buffer and for supplying it to the first external interface means when the output-incapable competition state is resolved.

In this configuration, the first external interface means is connected to the higher level of the memory hierarchy, and the second external interface means is connected to the lower level of the memory hierarchy. The basic operations of the read buffers and write buffers in response to a read/write access request by a processor are identical to the prior description. It should be noted that the read data outputted to the lower level of the memory hierarchy via the second external interface means would be provided only through the read buffers. This is because all the outputs of read data to the lower level of the hierarchy are assumed to involve reading operations for copy-back (or write-back) associated with write access by the processor. Since a copy-back operation is an operation to have data stored into the main memory in order to replace a dirty cache line in the case of a cache miss, and since, in many cases, a high throughput is not demanded for such reading actions, data paths that bypass the read buffers and logic circuits thereto for enabling the direct output of read data from the second external interface means are omitted so as to prevent a meaningless expansion of the logic scale of the circuitry.

When the above semiconductor integrated circuit is applidd to a multi-processor system, another processor would be connected to the lower level of the memory hierarchy, so that it is possible that the semiconductor integrated circuit operates also in response to the access by this other processor. In order to allow this, the first and the second external interface means may be made capable of externally inputting access requests and access addresses for the memory blocks individually.

In addition, in consideration of the resource competition when read data is supplied from the lower level to the higher level of the memory hierarchy via the semiconductor integrated circuit, the utility of the semiconductor integrated circuit as a cache memory would be maximized when it further includes a memory buffer capable of receiving and holding the data from the second external interface means, and of externally outputting the data it held from the second external interface means.

[5] When the memory blocks are formed by DRAMs, for example, the minimization of the access time of the DRAMs may be achieved also by a known page mode or static column mode. Moreover, in order to reduce the apparent access time of a memory block constituted by a DRAM, an input of data is parallel-converted and an output of data is serial-converted. That is, the semiconductor integrated circuit includes memory blocks each comprising a memory cell array, a row selection circuit, column selection circuits and, a serial-parallel converter circuit, a write amplifier, a main amplifier, a parallel-serial converter circuit. The memory cell array includes a plurality of memory cells, each including a selection terminal connected to a word line and a data input/output terminal connected to a bit line. The row selection circuit selects a word line specified by a row address signal in synchronization with a clock signal in response to the change in a row address strobe signal. The column selection circuit selects a plurality of bit lines specified by a column address signal in a parallel manner in synchronization with a clock signal in response to a change in a column address strobe signal. The serial-parallel converter circuit converts the write data serially inputted from the write buffer into parallel data in synchronization with the clock signal. The write amplifier outputs in parallel the output of the serial-parallel converter circuit to the plurality of bit lines selected by the column selection circuit. The main amplifier amplifies the parallel data outputted in parallel from the plurality of bit lines selected by the column selection circuit. The parallel-serial converter circuit converts the parallel data supplied from the main amplifier into serial data in synchronization with the clock signal and outputs it to the read buffer and the selection means.

The column address strobe signal, which changes in a cycle period that is n times (n is an integer equal to or greater than 2) the cycle of the clock signal, is inputted to the memory block and, during every cycle in which the column address signal changes, a plurality of serial data that have been read out from the memory cell array and parallel-serial-converted in synchronization with the clock signal are outputted from the memory block; or, the parallel data that have been inputted into the memory block in synchronization with the clock signal and serial-parallel-converted are written into the memory cell array. In this way, by the use of this access specification in which the column address strobe signal is changed once in n-cycles of the clock signal, the acceleration of the operation speed of the memory may be attempted.

The serial data input path for the serial-parallel-converter circuit, and the serial data output path for the parallel-serial converter circuit are preferably separately provided. In a read operation, after the data is read out from the memory cell array in response to the change in the column address strobe signal, serial data is outputted from the memory block after a time period required for the parallel-serial conversion; however, for a write operation, the conversion of the serial data inputted to the memory block into parallel data must be completed in advance prior to the writing of the parallel data into the memory cell array in response to the change in the column-address strobe signal. At this point, when the write operation is instructed sequentially after a read operation, it is likely that the sequential input operation of the serial data into the memory block for the write operation has to be performed in parallel with the output operation of the serial data from the memory block for the read operation. In other words, there is a high probability that the serial data output timing from the memory block and the serial data input timing into the memory block overlap. The separate provision of a serial data input path and a serial data output path for a memory block as previously mentioned makes it possible to prevent the collision of data even when such overlapping of the operations occurs, thus, efficient processing can be achieved.

[6] Where the propagation delay of read data is of concern, the semiconductor integrated circuit may employ the following layout. For example, a center-pad type chip is assumed, in which the bonding pads for signal input/output, or external connection electrodes, such as bump electrodes, are provided at the center region of a chip. In this case, memory blocks are disposed on the opposing sides of the semiconductor chip with a spacing therebetween. Provided between the opposing memory blocks are read buffers capable of holding read data read out from the respective memory blocks and write buffers capable of holding write data to be fed into the respective memory blocks. In the proximity of the read and write buffers, an external interface means is provided. External connection electrodes are provided in proximity to the external interface means. A write buffer receives and holds write data inputted to the external interface means, and when a corresponding memory block is write-enabled, supplies the write data to the memory block. A read buffer is capable of holding read data read out from a corresponding memory block in response to an external-output-incapable state in which the data cannot be externally outputted from the external interface means.

PREFERRED EMBODIMENTS

Figure 1:
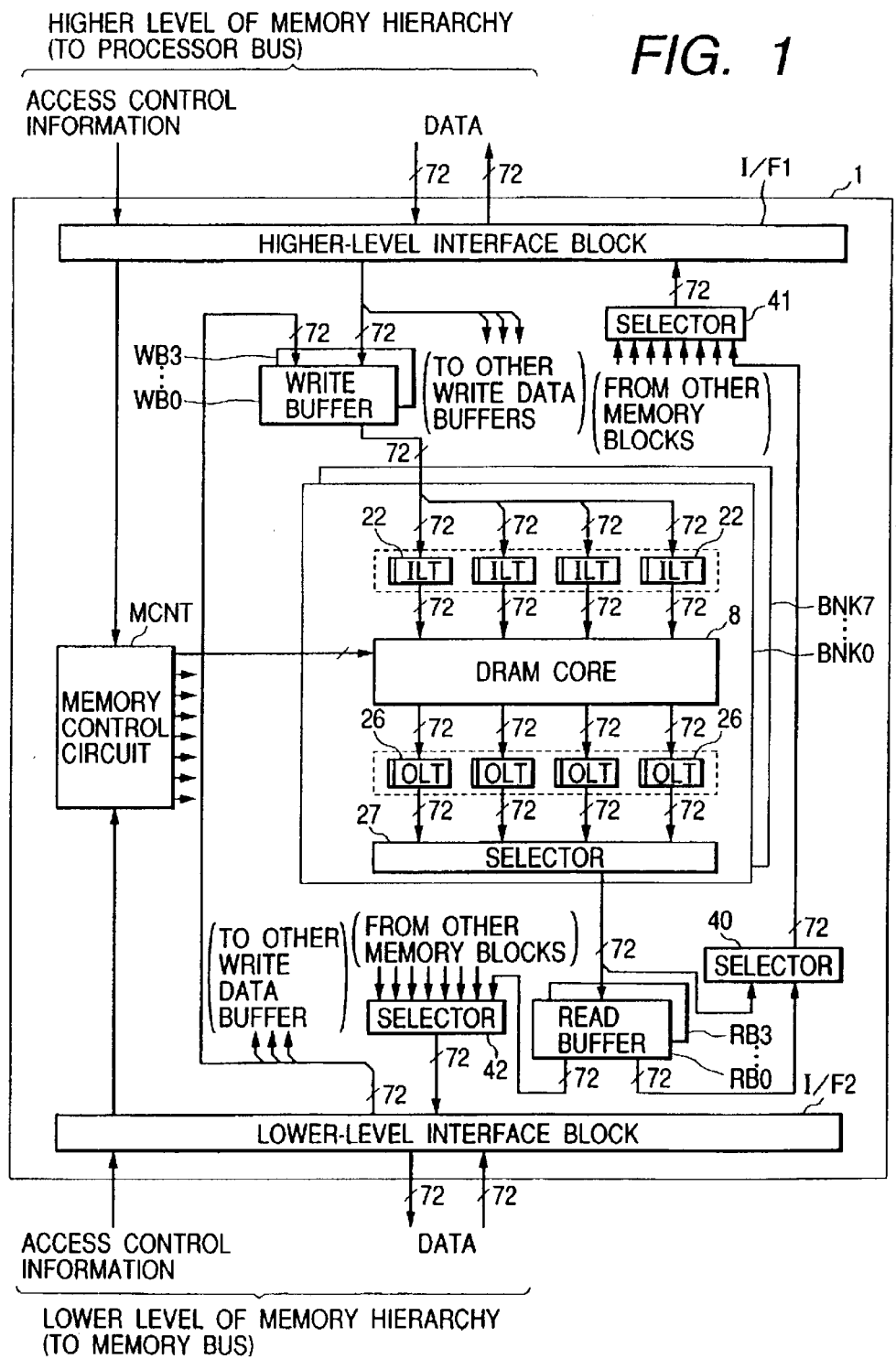
FIG. 1 is a block diagram showing the overall configuration of an exemplary semiconductor integrated circuit according to the present invention.

FIG. 1 shows a general view of an exemplary semiconductor integrated circuit according to the present invention. The semiconductor integrated circuit 1 shown in the figure is intended for use as an L3 cache memory, although the invention is not so limited, and it comprises 8 memory blocks BNK0–BNK7, 4 write buffers WB0–WB3, 4 read-buffers RB0–RB3, a higher-level interface block I/F1 connected to the higher level of the memory hierarchy (i.e. processor bus), a lower-level interface block I/F2 connected to the lower level of the memory hierarchy (i.e. memory bus), and a memory control circuit (MCNT).

The higher-level interface block I/F1 is connected to a processor bus or the like, which is, in turn, connected to a processor having, for example, built-in L1 and L2 cache memories, and it inputs access control data including access control signals and access address signals etc., and inputs/outputs 72-bit parallel data.

The lower-level interface block I/F2 is connected to a memory bus or the like, which is, in turn, connected to the lower level of the memory hierarchy such as a main memory or L4 cache memory etc., and it inputs/outputs 72-bit parallel data. Although the invention is not particularly so limited, the application of the invention to a multi-processor system is assumed, therefore the lower-level interface block l/F2 is configured to be capable of receiving access control data from a processor other than the processor in the higher level of the hierarchy so as to allow this processor also to access the memory blocks BNK0–BNK7.

The memory control circuit MCNT inputs the access control data, decodes a part of the address information included therein to determine the target memory block to be accessed, and outputs a local memory address and an access control signal to the target memory block to be accessed in order to control the operation of that memory block.

The memory block BNK0, which is representatively indicated, sequentially latches serially-inputted write data into four write registers (ILT) 22, respectively, by 72 bits (8 bytes), and the memory block is then write-enabled for accepting data into its DRAM core 8 as 288-bit (32-byte) parallel data. It also latches the read data read out as 288-bit parallel data from the DRAM core 8 into read registers (OLT) 26, respectively, by 72 bits; and, as a selector 27 sequentially selects the outputs of the read registers 26, the memory block can serially output the read data by 72, bits. Accordingly, the memory block BNK0 is capable of inputting/outputting the data at a speed 4 times quicker than the access time of the DRAM core 8. In this specification, "1 byte" is assumed to include 8-bit data and 1-bit parity data.

[A] Write data from the higher level of the memory hierarchy that has been inputted to the higher-level interface block I/F1 is supplied to the memory block BNK0 (BNK1–BNK7) via the write buffer WB0 (WB1–WB3).

There are three output paths for the read data read out from the memory block BNK0 (BNK1–BNK7): a higher-level through path, a higher-level buffering path, and a lower-level buffering path. The higher-level through path is a path which outputs data from the higher-level interface block I/F1 to the higher level of the memory hierarchy via the selectors 40 and 41 that are schematically shown in the figure. The higher-level buffering path is a path for outputting the read data temporarily stored in the read buffer RB0 (RB1–RB3) from the higher-level interface block I/F1 to the higher level of the memory hierarchy via the selectors 40 and 41. The lower-level buffering path is a path for outputting the read data temporarily stored in the read buffer RB0 (RB1–RB3) from the lower-level interface block I/F2 via the selector 42 to the lower level of the memory hierarchy. There is no through path to the lower level.

The read buffers RB0–RB3 and the write buffers WB0–WB3 are constituted by SRAMS. These SRAMs may be accessed at every cycle defined by the clock signal of the system. The SRAMs constituting the read buffers RB0–RB3 and the write buffers WB0–WB3 may be constructed to have the same structure as a conventional SRAM. Although the invention is not so limited, each of the above SRAms may have a memory array including a plurality of static memory cells, a plurality of word lines, and a plurality of complementary data line pairs, and an address decoder for selecting specific word lines in response to an address signal, a sense amplifier for amplifying the data of a plurality of the selected memory cells, and a data output circuit for outputting the amplified data.

As will be later described, each SRAM is configured in the manner so that 72 memory cells are simultaneously selected in response to one set of address signals being inputted. Each static memory cell comprises a pair of CMOS inverters including an n-channel MOSFET and a p-channel MOSFET, and further comprises a data storage section formed by cross-coupling the inputs and outputs of the pair of CMOS inverters, and selection transistors formed by a plurality of n-channel transfer MOSFETs for selecting the data storage section. The gate terminals of the plurality of selection transistors are selectively connected to a word line or word lines, and the source-drain paths of the plurality of selection transistors are coupled to a corresponding one or more of the plurality of complementary data lines, so that the memory cell is constructed to have multiple input/output ports. Each SRAM constituting each of the read buffers RB0–RB3 and write buffers WB0–WB3 is constructed in a 128×72 (word×bit) structure, although the invention is not so limited.

It should be noted that various modifications are possible for the structure of the multiple-I/O port type memory cell as it is readily understood by a person skilled in the art.

Figure 2:
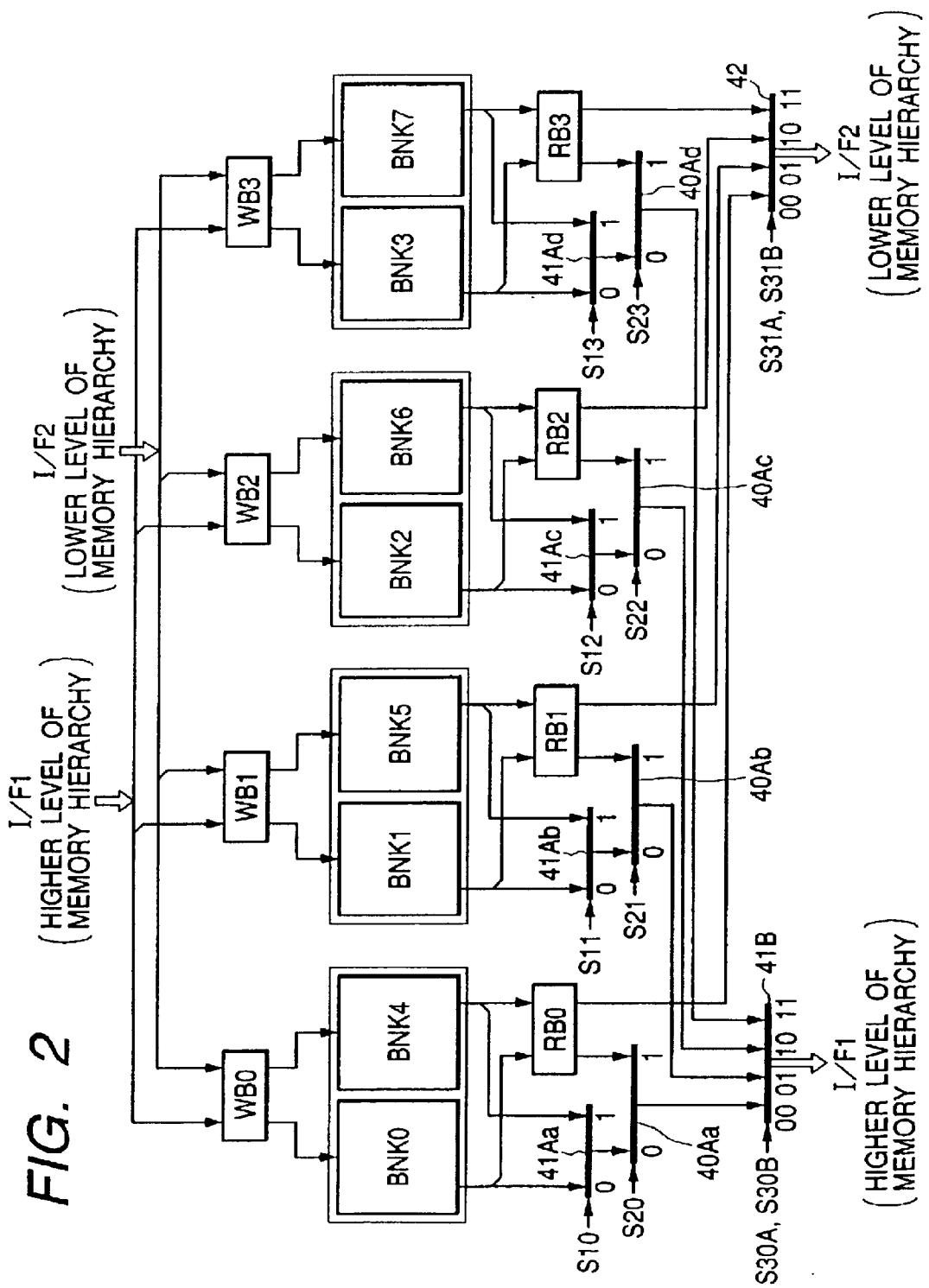
FIG. 2 is a block diagram showing details of read data output paths of the semiconductor integrated circuit of FIG. 1.

FIG. 2 shows exemplary output paths of the read data in the semiconductor integrated circuit 1. The memory blocks BNK0 and BNK1 share the read buffer RB0 and the write buffer WB0. Similarly, the memory blocks BNK2 and BNK3 share the read buffer RB1 and the write buffer WB1, the memory blocks BNK4 and BNK5 share the read buffer RB2 and the write buffer WB2, and the memory blocks BNK6 and BNK7 share the read buffer RB3 and the write buffer WB3. Although the invention is not limited, each of the read buffers RB0–RB3 and the write buffers WB0–WB3 has two read ports and two write ports. Each port is an 8-byte parallel access port.

A selector 41Aa is provided for selecting either the read data from the memory block BNK0, which is one of the pair, or the read data from the memory block BNK4, which is the other of the pair. For the other memory blocks, similar selectors 41Ab–41Ad are provided. Signals S10 through S13 are selection control signals of the selectors 41Aa–41Ad. A selector 40Aa is provided for selecting either the read data outputted fronlthe read buffer RB0 or the read data selected by the selector 41Aa. For the other memory blocks, similar selectors 40Ab–40Ad are provided. Signals S20 through S23 are selection control signals of the selectors 40Aa–40Ad. The output of one of the selectors 40Aa–40Ad is selected by a selector 41B and is fed to the higher-level interface block I/F1. The operation of the selector 41B is controlled by 2-bit selection signals S30A and S30B. The selector 42 selects the output of one of the read buffers RB0–RB3 outputted from one of the two read ports and feeds it to the lower-level interface block I/F2. The operation of the selector 42 is controlled by 2-bit selection control signals S31A and S31B.

Figure 3:
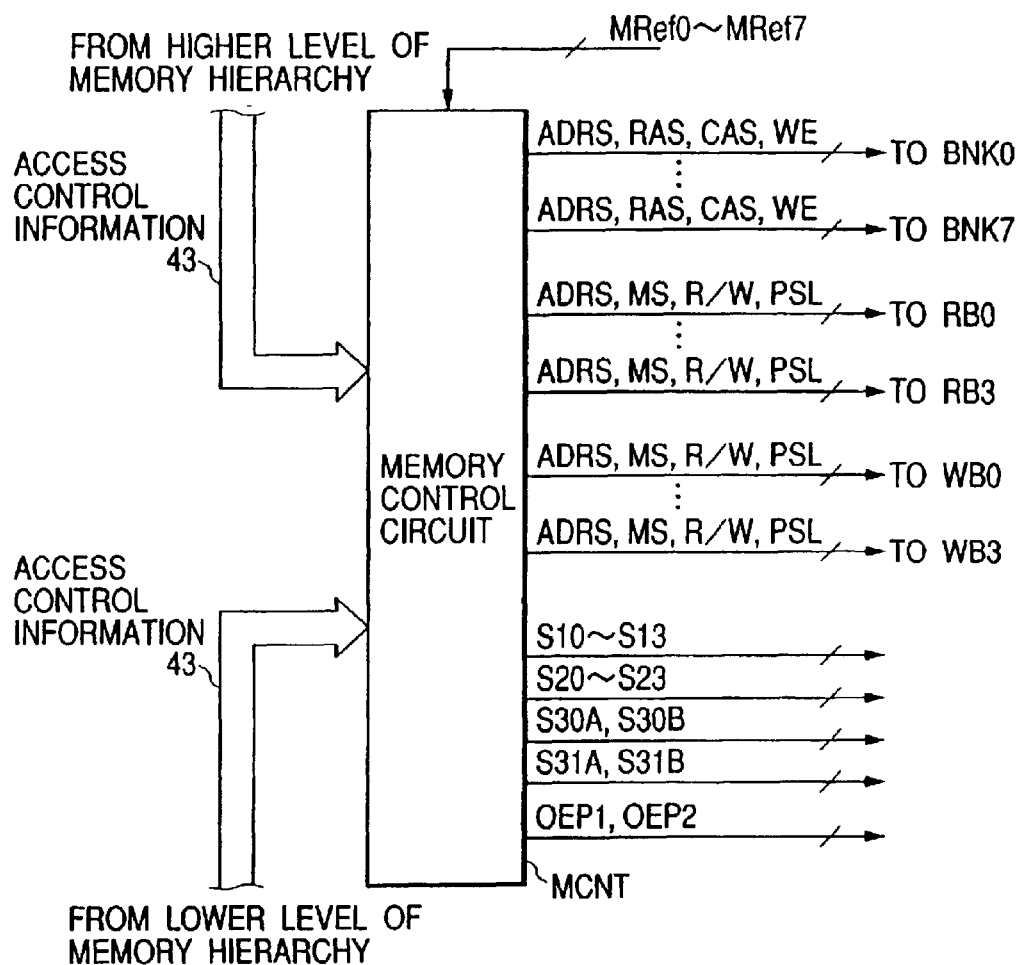
FIG. 3 is a block diagram showing exemplary control signals generated by a memory control circuit.

FIG. 3 shows exemplary control signals generated by the memory control circuit MCNT. The memory control circuit MCNT outputs, for each of the memory blocks BNK0–BNK7, an address signal ADRS, a row address strobe signal RAS, a column address strobe signal CAS and a write-enable signal WE etc.; and, for each of the read buffers-RB0–RB3, the memory control circuit MCNT outputs an address signal ADRS, a memory-enable signal MS, a read/write signal R/W and a port select signal PSL, while, for each of the write buffers WB0–WB3, it outputs an address signal ADRS, a memory enable signal MS, a read/write signal R/W and a port selection signal PSL. The memory control circuit MCNT also outputs the selector selection signals S10–S13, S20–S23, S30A, S30B, S31A and S31B; and, for the interface blocks I/F1 and I/F2, it outputs output-enable signals OEP1 and OEP2. The memory control circuit MCNT receives inputs of the access control data from both the higher level and lower level of the memory hierarchy, and provides control over the above-mentioned control signals so that an adequate control signal is activated at a specific timing to invoke the action instructed in the received access control data. The memory control circuit MCNT receives, respectively, from the memory blocks BNK0–BNK7, the inputs of signals MRef0–7 indicating the refresh action periods of the respective memory blocks BNK0–BNK7.

Figure 4:
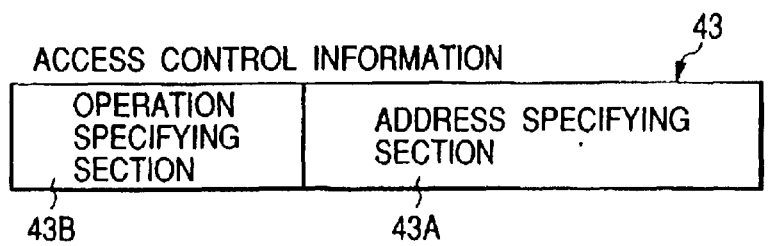
FIG. 4 is a diagram showing an exemplary data format of access control data.

The access control data 43 includes an address specifying section 43A and an operation specifying section 43B, as shown in FIG. 4. The address specifying section 43A includes information for specifying a memory block BNK0–BNK7 from which or to which data is to be read out or written and information for specifying an address within the memory block. The operation specifying section 43B specifies either read/write of 8-byte data from/to the address specified by the address specifying section, a read/write of sequential 16-byte data from/to the address specified by the address specifying section or read/write of sequential 32-byte data from/to the address specified by the address specifying section etc.

The memory control circuit MCNT receives external access requests so as to allow the memory blocks BNK0–BNK7 to operate in parallel to an extent that such operation does not cause resource competition within the semiconductor integrated circuit 1. The memory control circuit MCNT also control a the external output of read data by connecting one memory block selected from the memory blocks BNK0–BNK7 or one read buffer selected from the read buffers RB0–RB3 to the interface block I/F1 or I/F2.

Figure 5:
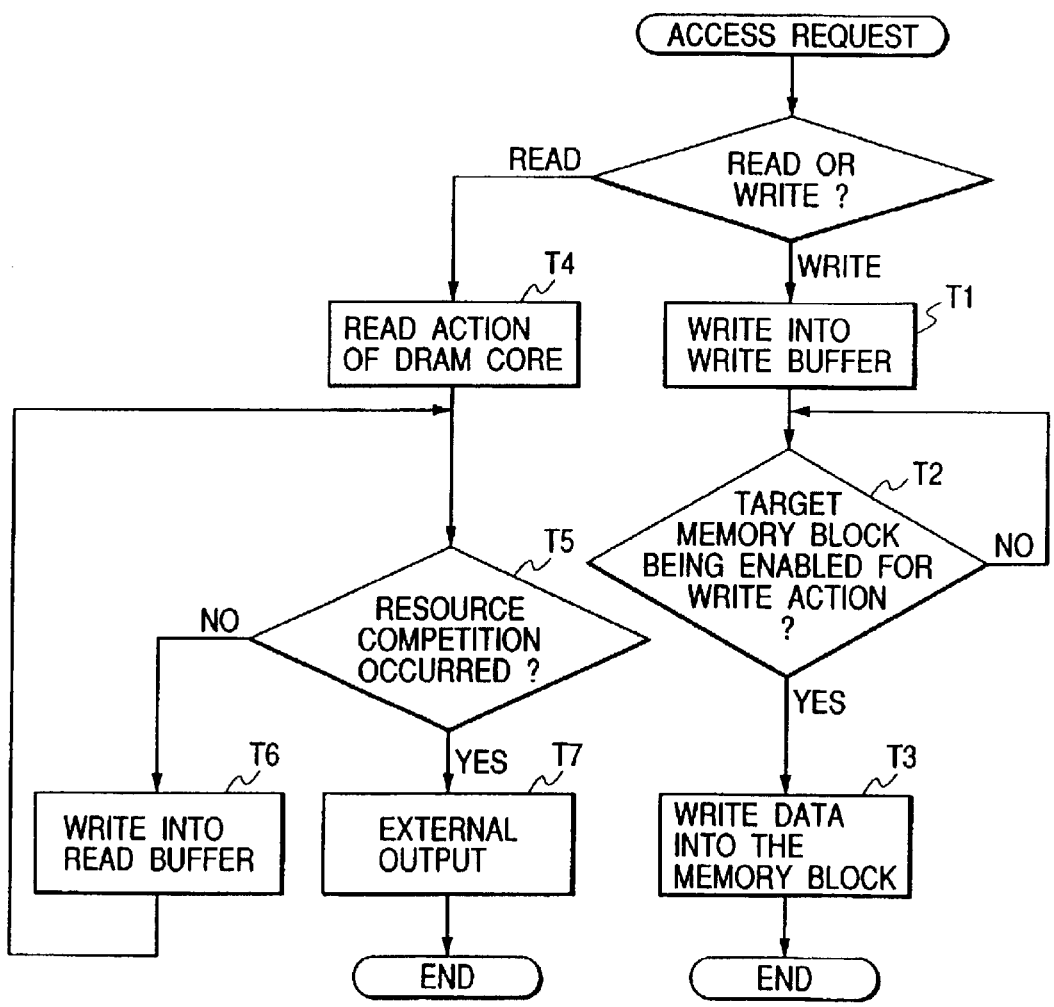
FIG. 5 is a flow chart showing representative controlling steps of the memory control circuit followed in response to an external access request.

FIG. 5 shows a representative flow of the major controlling operations provided by the memory control circuit MCNT in response to an external access request.

The memory control circuit MCNT, in response to a write access request, controls a corresponding one of the write buffers WB0–WB3 to receive write data in advance, regardless of whether or not there is any internal operation being carried out by the write-target memory block, such as a refresh operation etc. (T1). Thereafter, a determination is made to see whether or not the write-target memory block is engaged in any internal operation, such as refreshing etc., so that the write action is possible (T2); and, after it is determined that the memory block is in the write-enabled state, data write operation is performed to the target memory block (T3).

Figure 6:
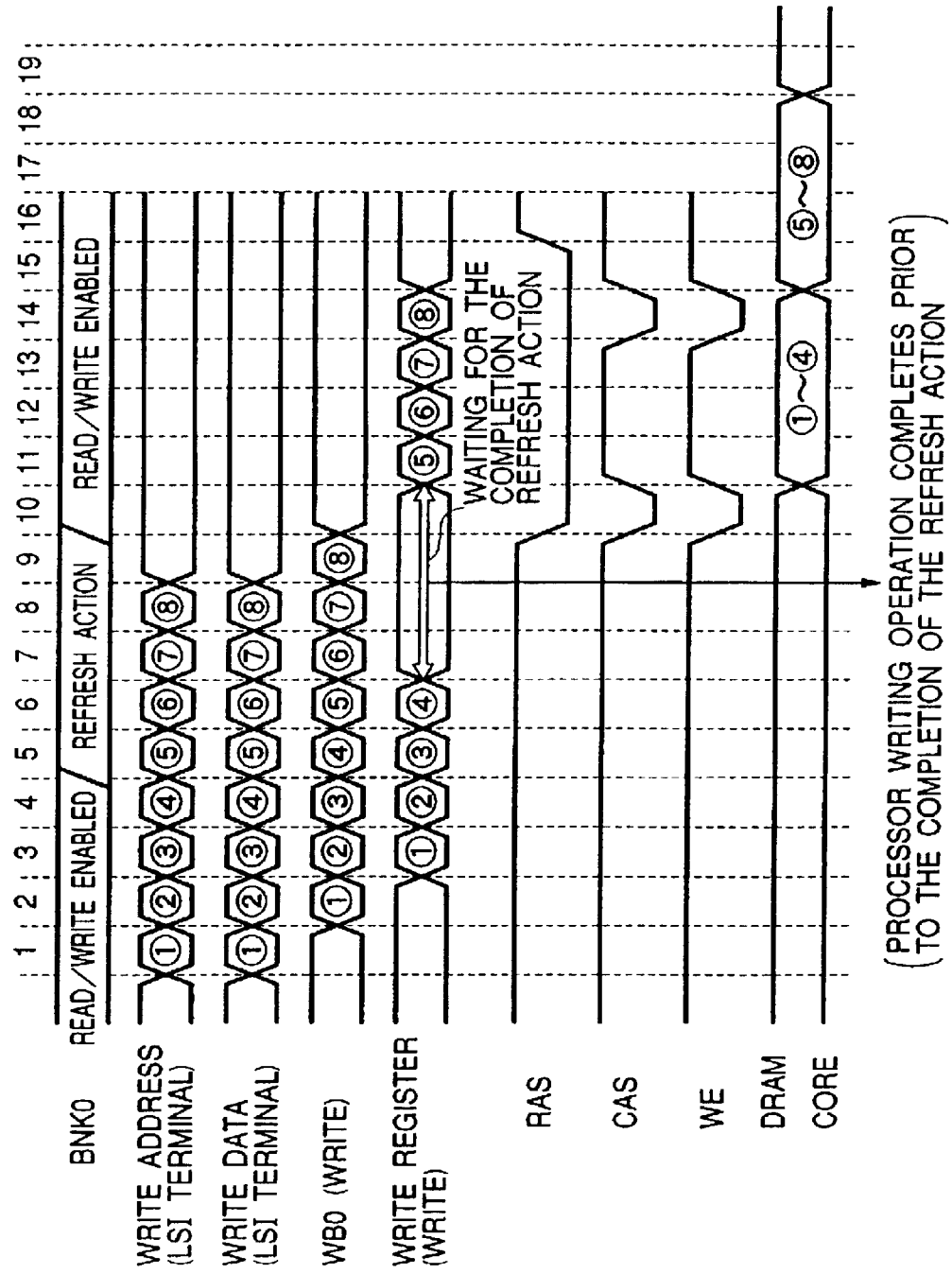
FIG. 6 is a timing chart of an exemplary write operation in a case in which a refreshing action occurs during a write access.

FIG. 6 shows an example of a write operation in a case in which a refresh operation occurs during the write access. In the example of FIG. 6, the write-target is the memory block BNK0. Each of the numerals (1) through (8) represents an access unit supplied from the outside of the semiconductor integrated circuit 1, and one access unit comprises 72-bit parallel data. Between operation cycles 4 to 9, the memory block BNK0 performs a refresh operation, and, during the cycles before and after the refresh operation, it is in the read/write-enabled state. The write data is sequentially stored in the write buffer WB0 with a delay of one cycle. The write data stored in the write buffer WB0 is sequentially supplied to the write registers 22 of the memory block BNK0 in every one cycle if the write-target memory block BNK0 is in the read/write-enabled state. By the time the data of the access unit (4) is being latched into a write register 22, the memory block BNK0 is already in the refresh act ion. The memory control circuit MCNT suspends the data transmission from the write buffer WB0 to the write registers 22 and waits until the refresh operation terminates. During this period, the writing of the write data into the write buffer WB0 continues. After the refresh operation of the memory block BNK0 terminates at operation cycle 9, the memory control circuit MCNT asserts the strobe signals RAS, CAS and WE to the memory block BNK0 at operation cycle 10, thereby giving a write address so that the data of the access units (1) through (4) are written into the DRAM core 8 in four cycles. In parallel to the writing to the DRAM core 8, the write data of the subsequent access units (5) through (8) are sequentially transmitted to the write register 22. The memory control circuit MCNT asserts the strobe signals RAS, CAS and WE to the memory block BNK0 at cycle14, giving a write address so that the data of the access units (5) through (8) are written into the DRAM core 8 in four cycles. As a result, the processor at the higher level of the memory hierarchy, which instructed the write access of (1) through (8) is released from the processing of this write access by the cycle 8 and is not affected the refresh operation in the memory block BNK0.

Figure 7:
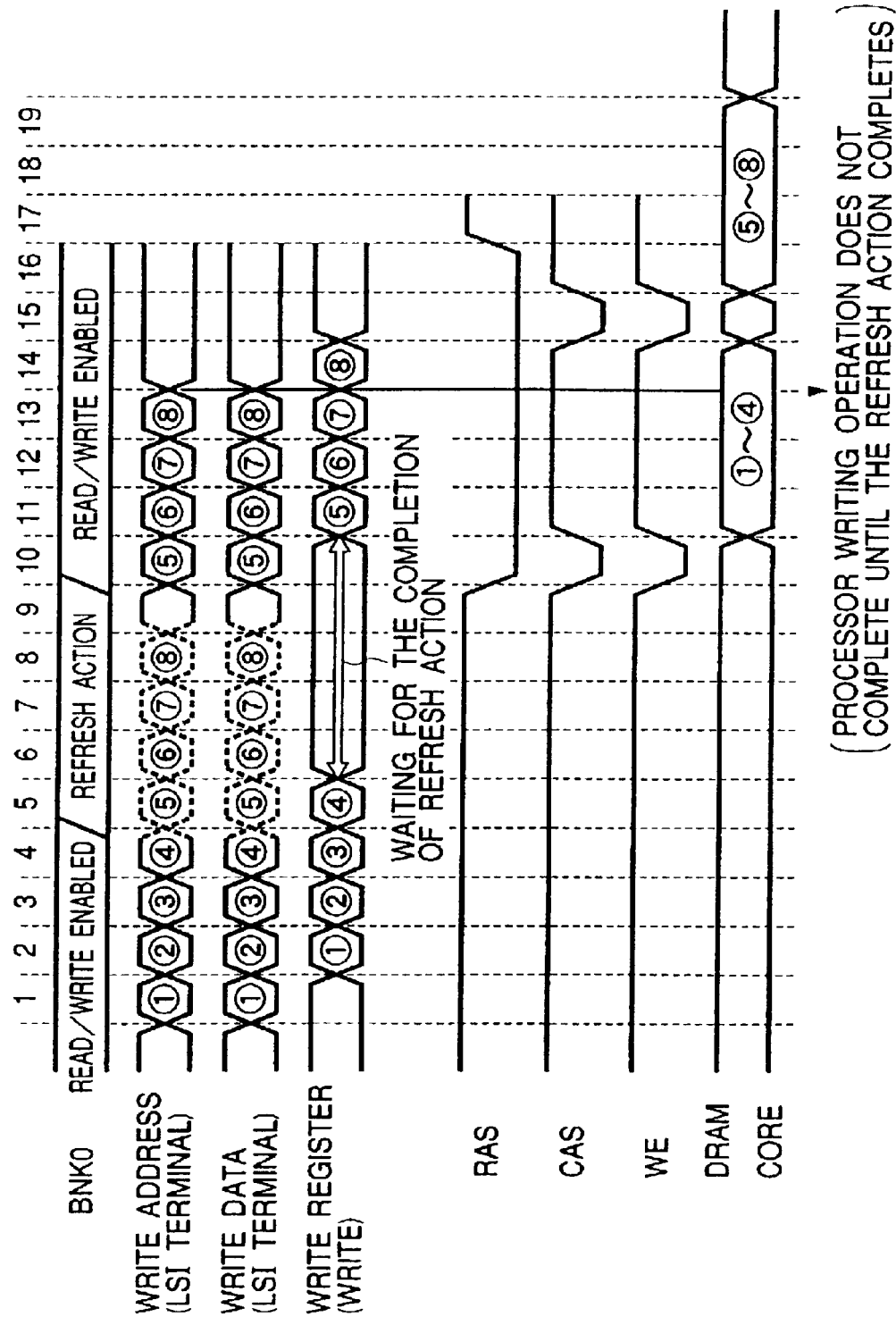
FIG. 7 is a timing chart of a comparative example of a write operation in a case where the write buffers are not provided.

FIG. 7 shows an example of a write operation in a case where the write buffer WB0 is not provided. In the case where the write buffer WB0 is not present, where a refresh action starts in the DRAM core 8, the processor at the higher level of the memory hierarchy, which instructed the write access, has to stop outputting the write address and write data, or it has to suspend issuance of the write access request in cycle 4 and wait until it can detect the completion of the refresh action. After cycle 9, at which the refresh operation terminates, the processor of, the higher level of the memory hierarchy reissues the write access request and starts outputting the addresses and data of the access units (5) through (8) sequentially from cycle 10. Accordingly, the writing of the write data of the access units (1) through (8) to the DRAM core 8 of the memory block BNK0 is completed in 19 cycles, but the processor at the higher level of the memory hierarchy which instructed this write access is not released from the write access processing until cycle 13. As apparent from the comparison with FIG. 6, by providing the write buffers WB0–WB3 in the semiconductor integrated circuit 1, which is used as the L3 cache memory, the data processing efficiency of the processor in the higher level may be substantially improved.

on the other hand, when the memory control circuit MCNT controls an external output of read data read out from one of the memory blocks BNK0–BNK7 via the interface block I/F1 or I/F2, it controls the selection of an output path (higher-level through path, higher-level buffering path or lower-level-buffering path) of the read data, thereby improving the throughput of the data read operation.

The-selection between the higher-level through path or the higher-level buffering path is made according to the determination by the memory control circuit MCNT whether or not there is a possibility of incurring a resource competition.

That is, the memory control circuit MCNT, as shown in FIG. 5, reads out data from the DRAM core 8 of the access-target memory block in response to a read access request (T4); determines whether or not there is a resource competition when externally outputting the read data from the higher-level interface block I/F1 (T5); and, where there is a resource competition, or where the read data cannot be externally outputted from the higher-level interface block I/F1, controls the corresponding one of the read buffers RB0–RB3 to hold the read data (T6). Where the external-output-incapable state is not present, it provides control for externally outputting either the read data read out from the memory block BNK0–BNK7 or the read data read out from the read buffer RB0–RB3 from the higher-level interface block I/F1 (T7).

Figure 8:
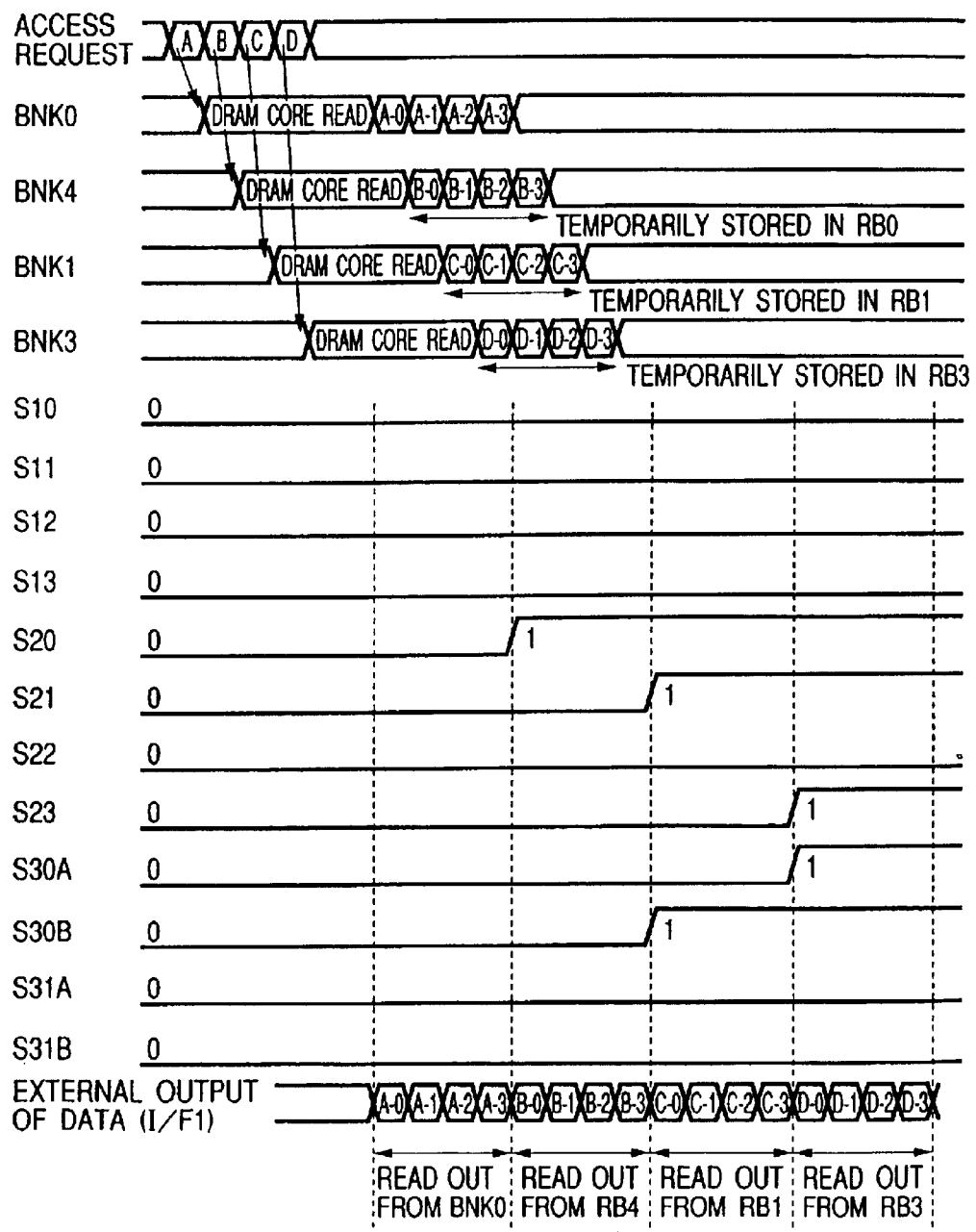
FIG. 8 is a timing chart of an exemplary read operation in a case where the read buffers are used.

FIG. 8 shows an example of a read action using the read buffers RB0–RB3. In FIG. 8, the processor of the higher level of the memory hierarchy sequentially issues access requests A–D in synchronization with the operation cycle of the system. The access request A is a read access request for reading out a series of consecutive 32-byte data A-0, A-1, A-2, A-3 from an address A of the memory block BNK0. Similarly, the access request B is a read access request for reading out a series of consecutive 32-byte data B-0, B-1, B-2 and B-3 from an address B of the memory block BNK4; the access request C is a read access request for reading out a series of consecutive 32-byte data C-0, C-1, C-2 and C-3 from an address C of the memory block BNK1; and the access request D is a read access request for reading out a series of consecutive 32-byte data D-0, D-1, D-2 and D-3 from an address D of the memory block BNK3.

When the access request A is received, the memory control circuit MCNT reads out in parallel the 288 bits of data specified by the address A from the DRAM core 8 of the memory block BNK0, and latches it into the read registers 26. The read registers 26 are then sequentially selected, and the read data A-0, A-1, A-2 and A-3 are outputted from the memory block BNK0 by 8 bytes. This output operation of the read data is performed at the operation cycle of the system (every 1 cycle). At this point, the higher-level interface block I/F1 is not engaged in any output operation. Accordingly, the memory control circuit MCNT directly transmits the output data A-0, A-1, A-2 and A-3 from the memory block BNK0 to the higher-level interface block I/F1 via the selectors 41A$a$, 40A$a$ and 41B for the external output.

In parallel with this operation, the next access request B is issued with a delay of 1 cycle, and the read data B-0, B-1, B-2 and B-3 are sequentially outputted from the memory block BNK4. The read data outputted are-then sequentially stored into the read buffer RB0. Similarly, in response to the next access request C, the read data C-0, C-1, C-2 and C-3 are sequentially outputted from the memory block BNK1 and stored into the read buffer RB1; and, in response to a yet later access request D, the read data D-0, D-1, D-2 and D-3 are sequentially outputted from the memory block BNK 3 and stored into the read buffer RB3. When the external data output by the higher-level interface block I/F1 is terminated, while the subsequent read data are being stored in the read buffers, the read data for the following access request is outputted from the read buffer for the external output. That is, following the output of the data A-3, the read data B-0, B-1, B-2 and B3 are sequentially outputted from the read buffer RB0; and, through the selection by the selectors 40A$a$ and 41B, they are externally outputted from the higher-level interface block I/F1. During the subsequent processing, the data C-0 through D-3 are externally outputted sequentially.

Figure 9:
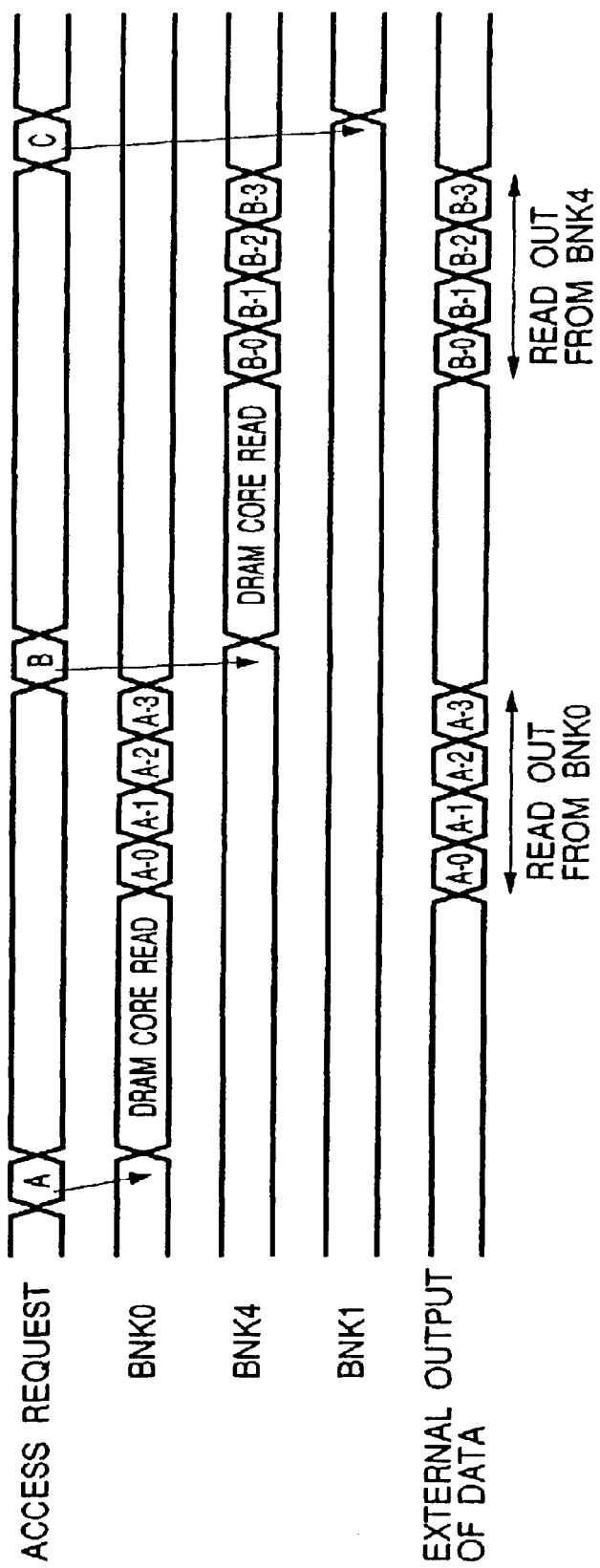
FIG. 9 is a timing chart of a comparative example of a read operation in a case where the read buffers are not provided.

On the other hand, as shown in FIG. 9, if there is no read buffer, then the later access requests would not be accepted until the read data associated with the first access request A are all externally outputted. In different memory blocks, at least the output operations of the read registers should not compete.

As apparent from the above description, by employing the read buffers RB0–RB3, the internal actions of the memory blocks can be allowed to proceed, while accepting subsequent read access requests in advance; and, in addition, by employing an SRAM having a higher access speed than a DRAM for the read buffers, the output operation of the buffered data would not be delayed, thereby improving the throughput of the data read operation.

Furthermore, if there is no resource competition when data is read out from a memory block BNK0–BNK7, the read data is externally outputted directly from the higher-level interface block I/F1 without the intervention of a read buffer RB0–RB3, so that the meaningless data buffering can be avoided when there is no data competition. Thus, such a feature contributes to the improvement in the throughput of the read data output action.

Next, the semiconductor integrated circuit 1 will be explained with reference to a case where it is applied to a cache memory system.

Figure 10:
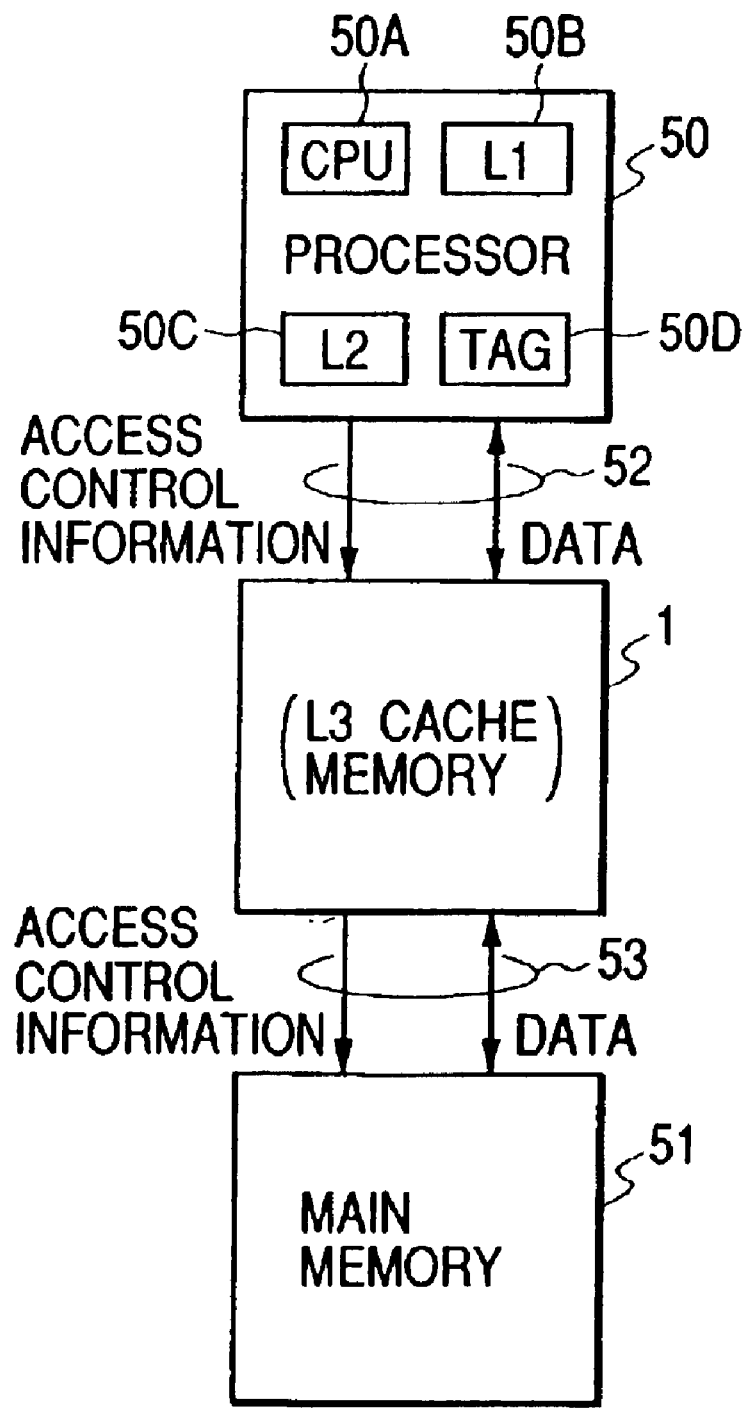
FIG. 10 is a block diagram of a cache memory system in which the semiconductor integrated circuit is used as the L3 cache memory.

FIG. 10 shows a first example of the cache memory system. The semiconductor integrated circuit 1 is used as an L3 cache memory disposed between a processor 50 and a main memory 51. To the higher-level interface block I/F1 of the semiconductor integrated circuit 1, a processor bus 52 is connected; and, through this bus, the data input/output operations from/to the processor are performed, and access control data from the processor 50 is received. To the lower-level interface block I/F2 of the semiconductor integrated circuit 1, a memory bus 53 is connected for the input/output operation of data from/to the main memory 51. The access control data to the main memory 51 is data issued by the processor 50, although the invention is not so limited.

The processor 50 includes a built-in L1 cache memory 50B and an L2 cache memory 50C along with a CPU 50A, and further includes tag control logic (TAG) 50D for the L3 cache memory. The semiconductor integrated circuit 1 is viewed as the data memory portion of the L3 cache memory. The tag control logic 50D holds the information which associates an index address with a tag address of a cache entry for each cache line of the semiconductor integrated circuit 1 operating as the L3 cache memory. It further includes, for each of the cache lines, a valid bit indicating the of that cache line, and a dirty bit indicating the necessity of a copy-back or write-back to the lower level of the memory hierarchy at the time of replacement of that cache line.

In FIG. 10, the next lower level of the semiconductor integrated circuit 1 in the memory hierarchy is not limited to the main memory, and it may also be an L4 cache memory. The tag controlling section for the L4 cache memory may be incorporated in the processor 50.

Figure 11:
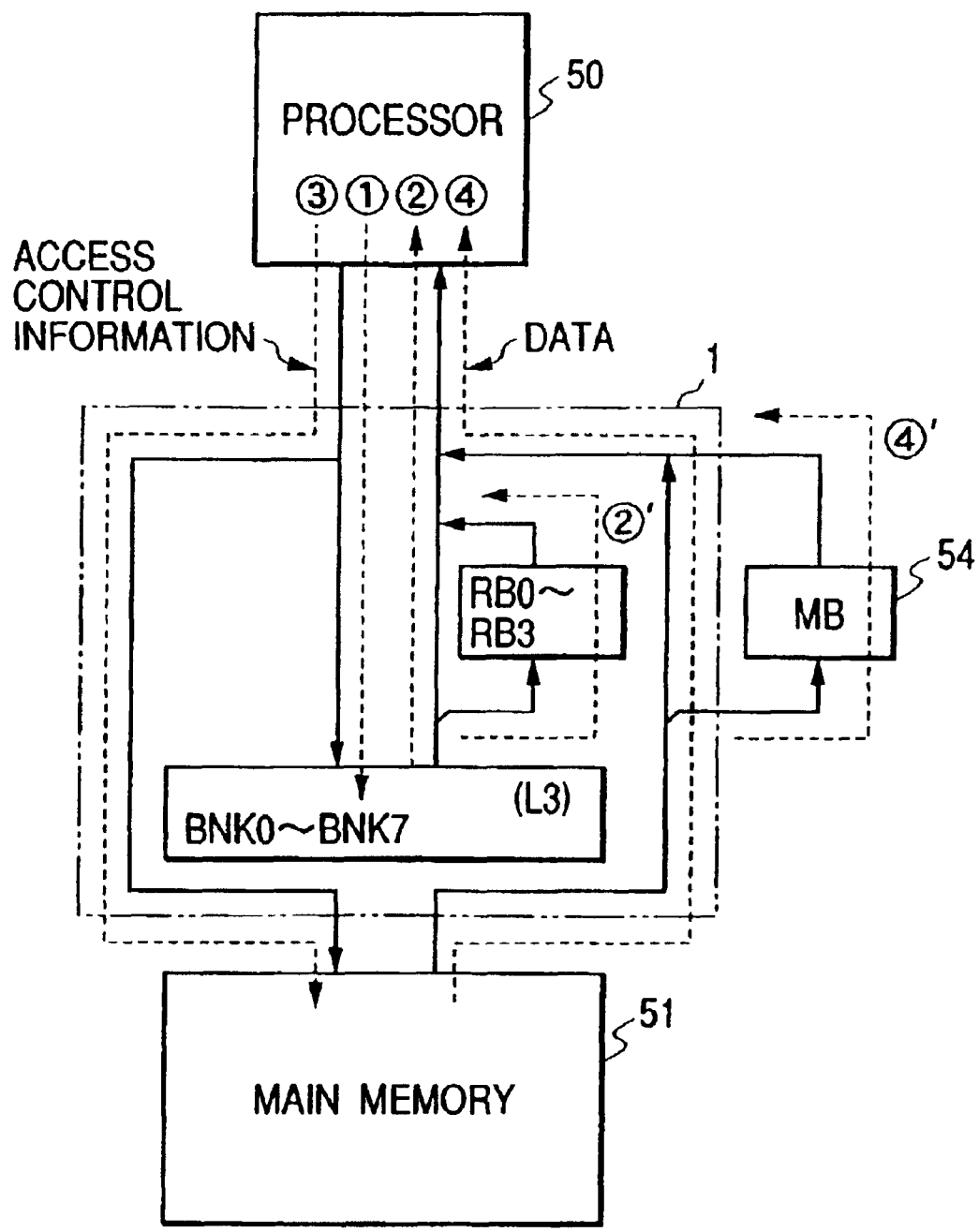
FIG. 11 is a block diagram showing the data flow during a read access operation by the processor in the cache memory system of FIG. 10.

FIG. 11 shows a data flow of a read access operation by the processor in the cache memory system of FIG. 10. When a cache miss occurs in the built-in L1 cache memory 50B and the L2 cache memory 50C of the processor 50, and there is a cache hit in the semiconductor integrated circuit 1, as determined by the tag control logic 50D, the processor 50 issues a read access request for the semiconductor integrated circuit 1 as the target. The access control data path at this point is (1). As previously explained, if there is no resource competition, the read data is returned directly from the memory block BNK0–BNK7 to the processor 50 (path (2)). When there is a resource competition, the read data is first retained in one of the read buffers RB0–RB3 and then is returned to the processor 50 from this read buffer RB0–RB3 at a timing that would not cause a resource competition (path (2)'). In the event that there is a cache miss also in the semiconductor integrated circuit 1, then the processor 50 feeds the access control data to the main memory 51 (path (3)), and the read data from the main memory 51 is returned to the processor 50 (path (4)).

At this time, assuming that there is a competition over the bus in the path (4) due to the affect from another circuit module, the read data cannot be sent from the main memory 51 to the processor 50. When the bus competition is resolved, the processor 50 has to reissue the access request to the main memory 51 to, again, access the main memory 51 that is constituted by a DRAM having a low access speed. Accordingly, as shown in FIG. 11, it is preferred to provide between the main memory 51 and the processor 50 a memory buffer (MB) 54 constituted by a SRAM etc. similar to those constituting the read buffers RB0–RB3 for supporting high-speed access.

The memory buffer 54 may be built into the semiconductor integrated circuit 1. The memory buffer 54 can be configured to receive and hold data from the lower-level interface block I/F2, and to externally output the data it holds from the higher-level interface block I/F1. The read data outputted from the memory buffer 54 and the read data outputted from the memory blocks BNK0–BNK7 only have to be exclusive to each other. For example, the processor 50 can be configured to drive the memory buffer 54 through a direct designation.

Figure 12:
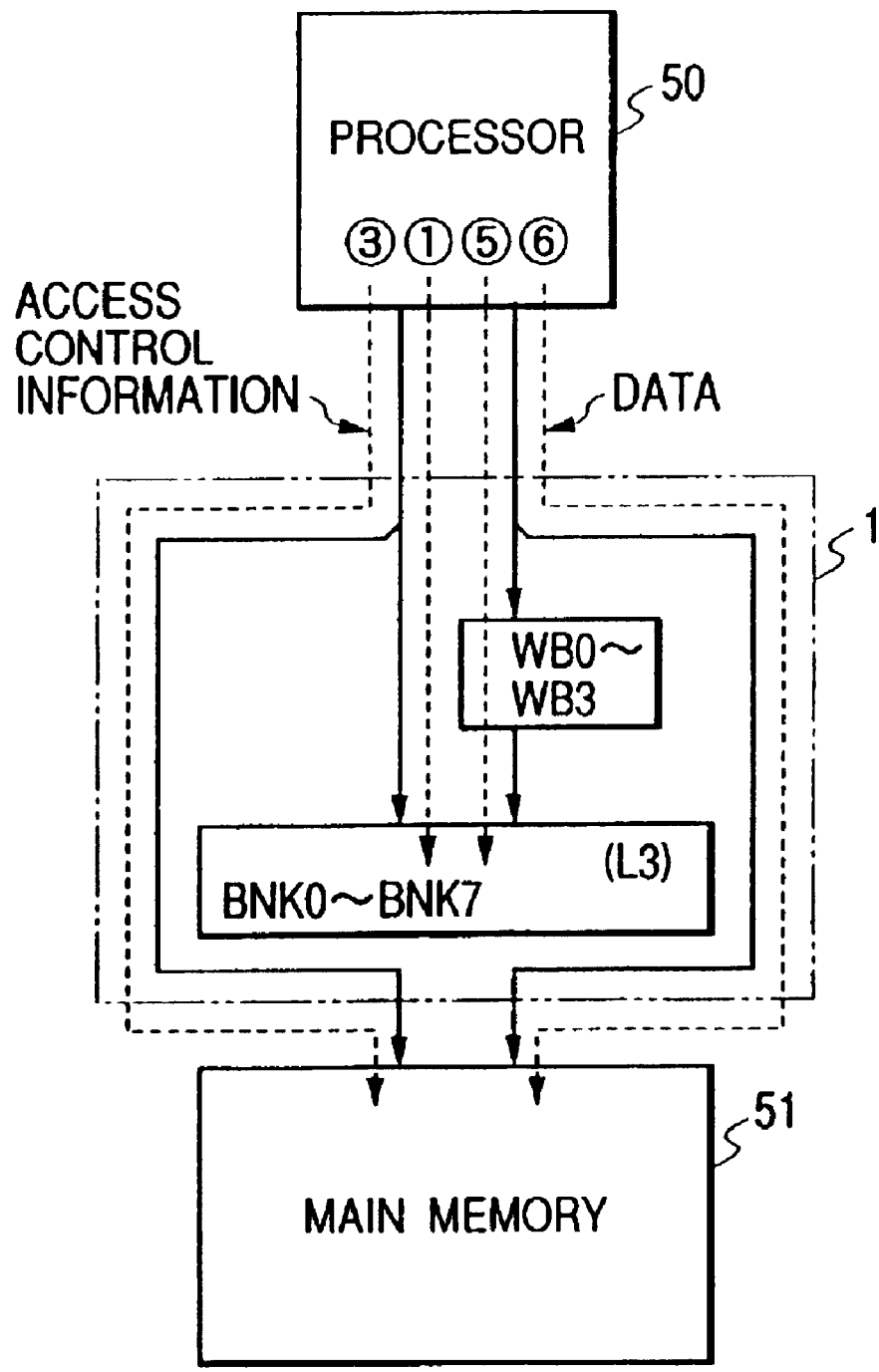
FIG. 12 is a block diagram showing the data flow during a write access operation by the processor in the cache memory system of FIG. 10.

FIG. 12 shows the dataflow in a write access operation by the processor in the cache memory system of FIG. 10. In a write access operation by the processor 50, where there is a cache miss in the built-in L1 cache memory 50B and L2 cache memory 50C of the processor, and there is a cache hit in the semiconductor integrated circuit 1, as determined by the tag control logic 50D, the processor 50 issues a write request to the semiconductor integrated circuit 1 as the target. The access control data path at this time is path (1). As previously explained, the write data is first stored in one of the write buffers WB0–WB3, and then it is written into the write-target memory block from the write buffer, when the write-target memory block is write-enabled (path (5)). Since the semiconductor integrated circuit 1 has the write buffers WB0–WB3, even when a refresh action of the memory block occurs in the middle of the write request, the write request does not have to be suspended. Accordingly, the processor 50 may be released quickly from the write operation. In the event that there is a cache miss also in the semiconductor integrated circuit 1, the processor 50 feeds the access control data to the main memory 51 (path (3)), and sends the write data to the main memory 51 (path (6)).

Figure 13:
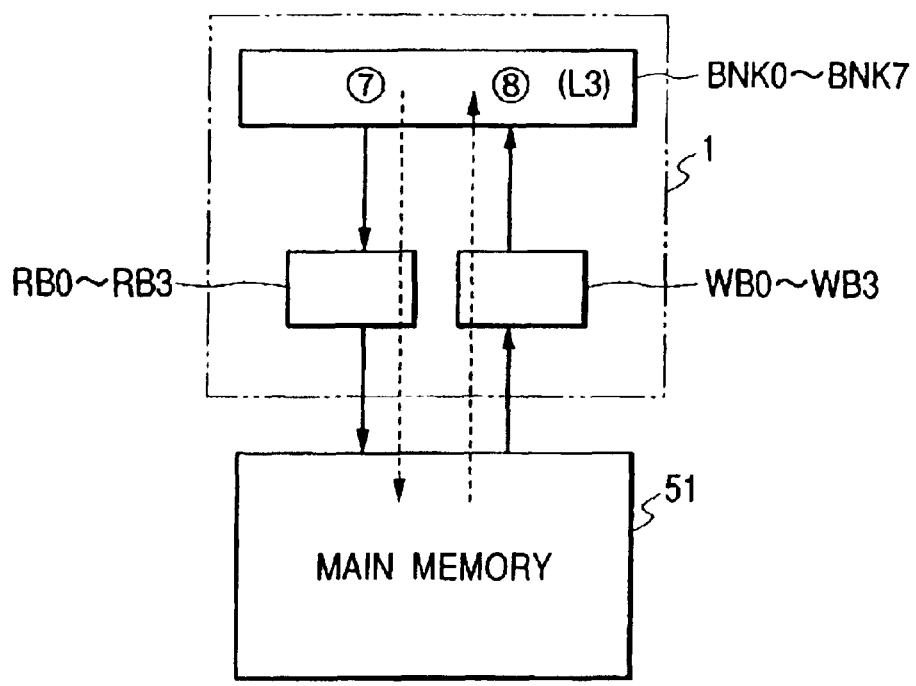
FIG. 13 is a block diagram showing the data flow during the replacement of a cache line in the cache memory system of FIG. 10.

FIG. 13 shows the data flow during a replacement of a cache line in the cache memory system of FIG. 10. In order to replace a specific cache line in one of the memory blocks BNK0–BNK7, in response to the occurrence of a cache miss in the semiconductor integrated circuit 1 during a write access or a read access, when the dirty bit of that cache line is in an enabled-state, the entry of the cache line must be copied back to the lower-level area of a corresponding tag address. The data to be copied back can be stored from that memory block BNK0–BNK7 to a read buffer RB0–RB3, so that it is not necessary to wait for the data to be actually copied back to the main memory 51, which is constituted by a DRAM having a low access speed. The data of the new cache entry for the replacement can be written into a write buffer WB0–WB3 from the main memory 51 without waiting for the data which must be copied back to be transmitted to the read buffer RB0–RB3. In this way, the throughput of the subsequent data read operation by the processor 50 may be improved even when the process involves a replacement of a cache line.

As explained with reference to FIGS. 1 and 2, the connections between the lower-level interface block I/F2 and the memory blocks BNK0–BNK7 are only those paths routing the read buffers RB0–RB3, and there is no through path as with the higher level. A copy back is an action for evacuating data into the main memory in order to replace a dirty cache line at the time of a cache miss; and, for a read action in such a case, a high throughput is not likely to be required, so that the data buses that bypass the read buffers RB0–RB3 for allowing the direct output of read data from the lower-level interface block I/F2 and the logic circuits thereto may be omitted, thereby preventing meaningless expansion of the logic scale of the semiconductor integrated circuit 1.

Figure 14:
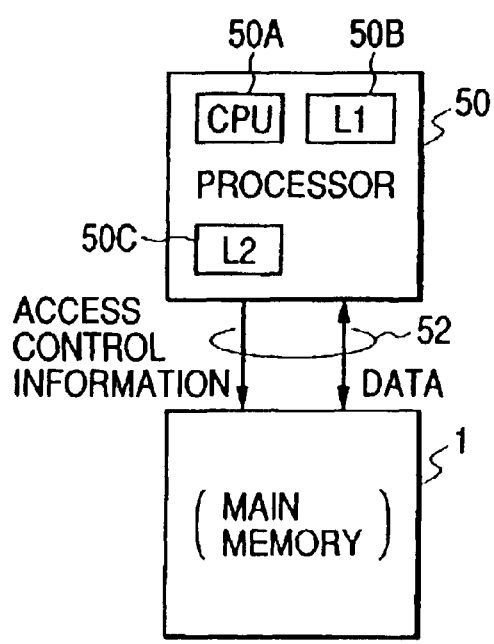
FIG. 14 is a block diagram of a memory system using the semiconductor integrated circuit as a main memory of a processor.

FIG. 14 shows a second example of the cache memory system. It is also possible to use the semiconductor integrated circuit 1 as the main memory of the processor 50. In this case, the use of the lower-level interface block I/F2 in the semiconductor integrated circuit 1 is not required.

Figure 15:
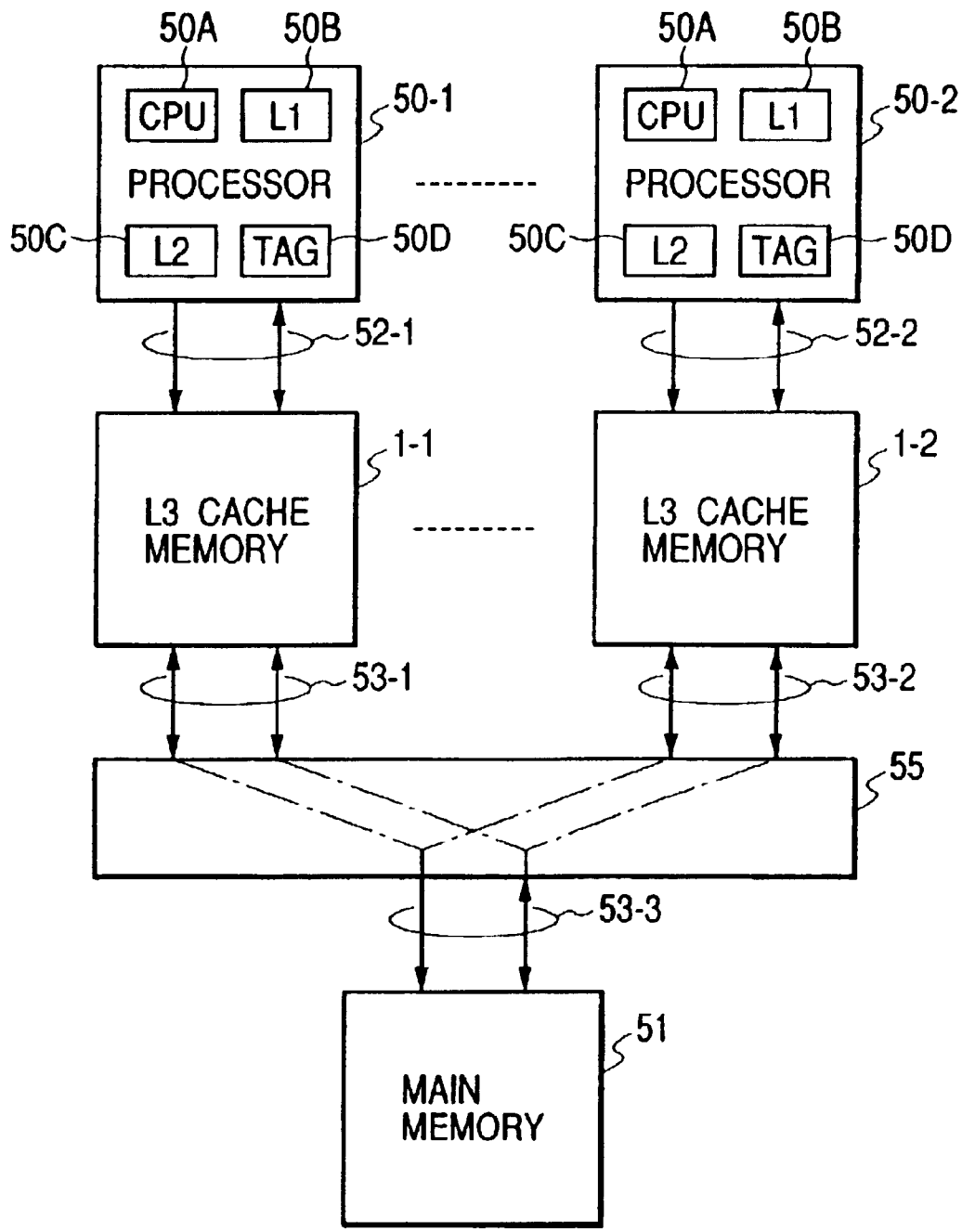
FIG. 15 is a block diagram of an example in which the semiconductor integrated circuit is applied to a multi-processor system as the L3 cache memory.

FIG. 15 shows a third example of the cache memory system. The exemplary cache memory system shown in this figure is implemented in a multi-processor system, which comprises, although the invention is not so limited, processors 50-1 and 50-2 connected respectively to L3 cache memories 1-1 and 1-2, each of which is constituted by the semiconductor integrated circuit 1, that are, in turn, connected to the main memory 51 via a bus switch circuit 55.

The L3 cache memories 1-1 and 1-2 are coupled to the processors 50-1 and 50-2 through processor buses 52-1 and 52-2, that are connected to their higher-level interface blocks I/F1 and perform the input/output of data to/from the processors 50-1 and 50-2, and also receive the input of access control data outputted by the processors 50-1 and 50-2. The lower-level interface blocks I/F2 of the L3 cache memories 1-1 and 1-2 are connected to the bus switch circuit 55 via memory buses 53-1 and 53-2, respectively, and the main memory 51 is connected to the bus switch circuit 55 via the memory bus 53-3.

Although the invention is not particularly limited as such, the bus switch circuit 55 selectively creates a connection state of a bus among the first through fourth buses. The first bus connection state transmits the access control data outputted by the processor 50-1 to the main memory 51, enabling data input and output between the main memory 51 and L3 cache memory 1-1 or the processor 50-1. The second bus connection state transmits the access control data outputted by the processor 50-2 to the main memory 51, enabling data input/output between the main memory 51 and the L3 cache memory 1-2 or the processor 50-2. The third bus connection state transmits the access control data outputted by the processor 50-1 to the L3 cache memory 1-2, enabling data input/output between the L3 cache memory 1-2 and the processor 50-1 or the L3 cache memory 1-1. The fourth bus connection state transmits the access control data outputted by the processor 50-2 to the L3 cache memory 1-1, enabling data input/output between the L3 cache memory 1-1 and the processor 50-2 or the L3 cache memory 1-2.

The L3 cache memory 1-2, in order to correspond to the third bus connection state, is configured to be capable of performing a cache memory operation in response to reception of the access control data outputted by the processor 1-1 to its lower-level interface block I/F2. Similarly, the L3 cache memory 1-1, in order to correspond to the fourth bus connection state, is configured to be capable of performing a cache memory operation in response to reception of the access control data outputted by the processor 1-2 to its lower-level interface block I/F2.

Figure 16:
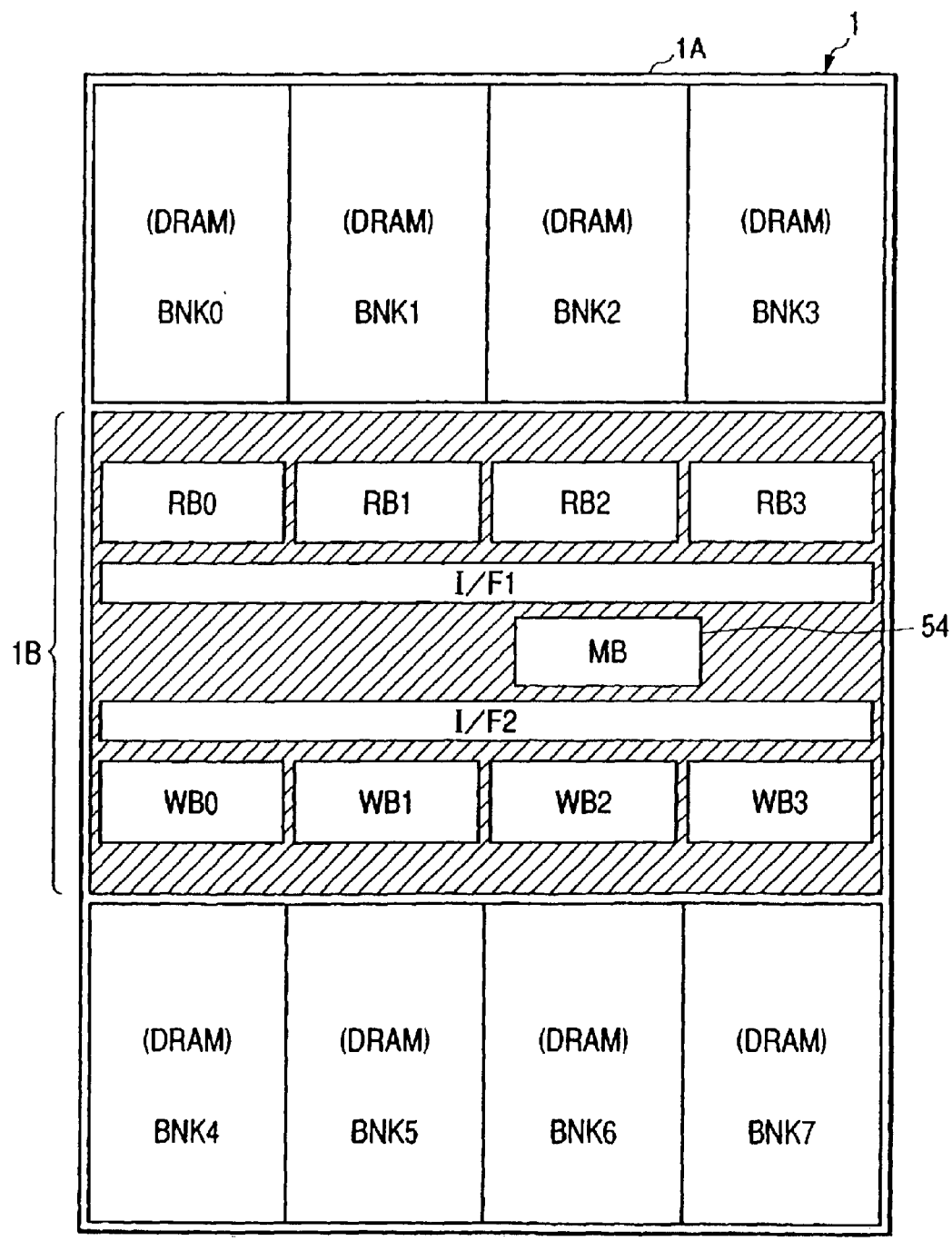
FIG. 16 is a layout diagram showing an exemplary chip layout of a semiconductor integrated circuit according to the present invention.

FIG. 16 shows a chip layout of the semiconductor integrated circuit 1. The center portion of the principal surface of a rectangular semiconductor chip 1A, such as one made of monocrystalline silicon, is designated as a logic circuit region 1B, and, in its upper and lower areas, the memory blocks BNK0–BNK3 and the memory blocks BNK4–BNK7, respectively, are separately arranged. In the edge portions of the logic circuit region 1B, the read buffers RB0–RB3 and the write buffers WB0–WB3 are separately disposed. Between the read buffers RB0–RB3 and the write buffers WB0–WB3, interface blocks I/F1 and I/F2 are arranged separately. In the proximity of the interface blocks I/F1 and I/F2, a large number of external connection electrodes (not shown), such as bonding pads or bump electrodes, are provided. Although the invention is not so limited, the buffer memory (MB) 54 previously described with reference to FIG. 11 may be provided between the interface blocks I/FI and I/F2. Although it is not illustrated in the figure, a number of other logic circuits are also provided within the logic circuit region 1B.

By employing the layout of FIG. 16, the read buffers RB0–RB3 are arranged closer to the interface blocks I/F1 and I/F2 and the external connection electrodes than the memory blocks BNK0–BNK7. In this way, the operation delay and the propagation delay associated with the paths for the external output of read data from the read buffers RB0–RB3 can be restrained from being excessively large when compared with the operation delay and the propagation delay associated with the direct paths for the external output of read data from the read registers of the memory blocks BNK0–BNK7 which bypass the read buffers RB0–RB3. Therefore, the above layout can contribute to the improved throughput of data read operations.

Figure 17:
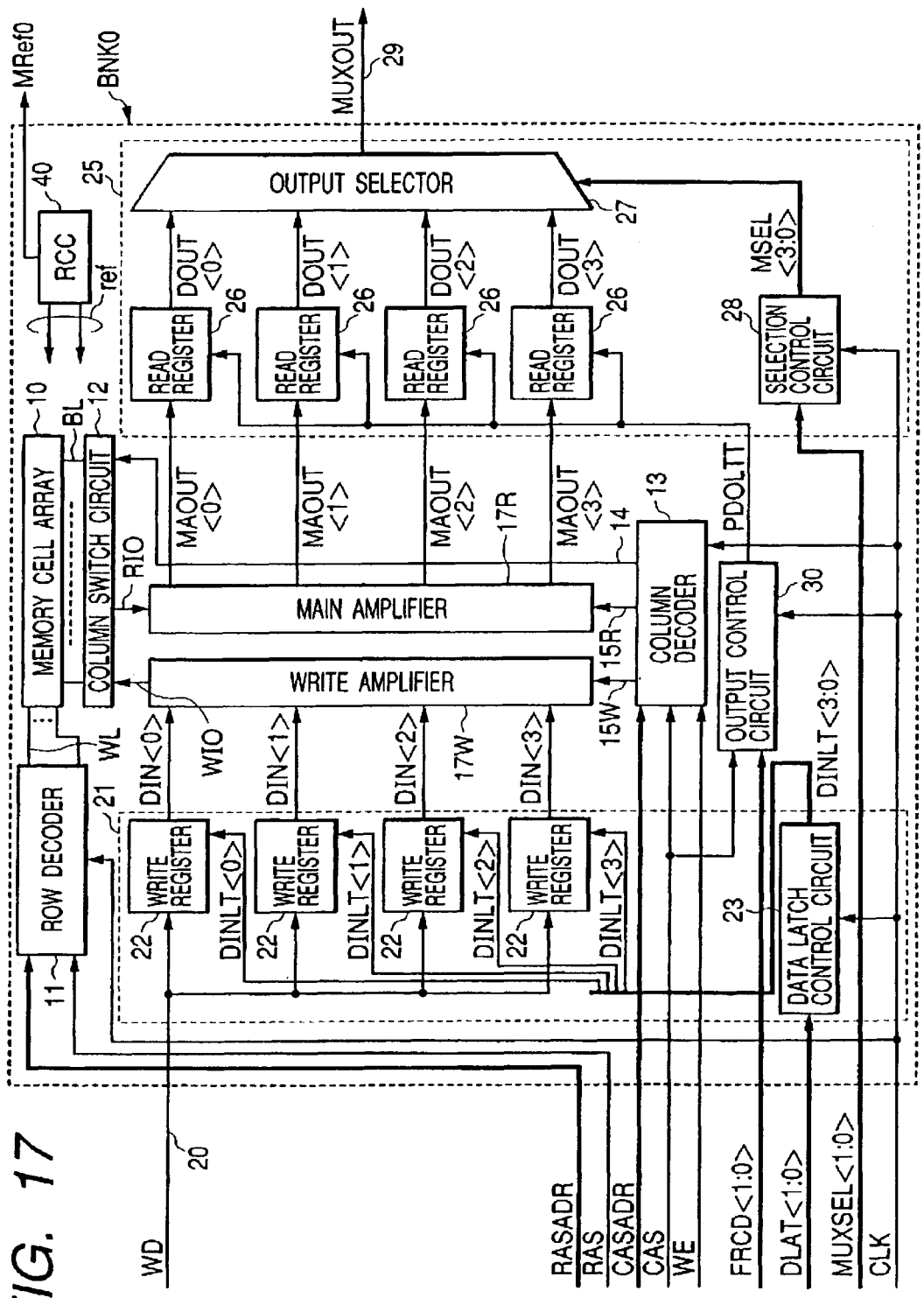
FIG. 17 is a detailed block diagram of an exemplary memory block.

FIG. 17 shows an exemplary memory block in detail. The memory block BNK0 which is representatively illustrated in the figure includes a memory cell array 10 in which dynamic memory cells (not shown) are arranged in the form of a matrix. A dynamic memory cell comprises a capacitance element for storing data and a selection transistor constituted by an n-channel MOSFET coupled to the capacitor element, wherein a selection terminal, which is the gate of the selection transistor, is connected to a word line WL, one end of the source-drain path of the selection transistor is coupled to the capacitor element, and the other end of the source-drain path of the selection transistor, or a data I/O terminal, is coupled to a complementary bit line BL. Although it is not particularly illustrated, the complementary bit line has a folded bit line structure centering a sense amplifier, and a precharge circuit etc. is provided between the complementary bit lines.

A row decoder 11 operates as a row-selection circuit for selecting a word line WL specified by a row address signal RASADR in response to a falling change of the row address strobe signal RAS. The selection of the complementary bit lines BL is performed by a column decoder 13 and a column switch circuit 12. The column decoder 13 generates a column address signal 14 for selecting, in parallel, a plurality of complementary bit lines specified by a column address signal CASADR in response to a falling change of the column address strobe signal CAS. The column decoder 13 also activates a write signal 15W in response to the instruction of a write operation given by the low level of a write enable signal WE, and activates a read signal 15R in response to the instruction of a read operation given by the high level of the write enable signal WE. The column switch circuit 12 performs the switching operation in response to the column selection signal 14, and connects 32 bytes (288 bits) of the complementary bit lines specified by this signal 14 to 32 bytes of a complementary write data line WIO and 32 bytes of a complementary read data line RIO respectively.

To the complementary write data line WIO, 32 bytes of write data outputted by a write amplifier 17W are supplied in parallel. Similarly, to the complementary read data line RIO, 32 bytes of read data are supplied in parallel by a main amplifier 17R. The write amplifier 17W has 288 write amplifying circuits; and, in response to the activation of the write signal 15W, it is enabled for the 288-bit parallel output operation of an amplified signal for the 288 bits of write data DIN<0>–DIN<3> inputted in parallel to the complementary write data line WIO. The main amplifier 17R has 288 read amplifying circuits; and, in response to the activation of the read signal, it is enabled for the parallel output of an amplified signal for the input from the complementary read data line RIO as 288 bits of read data MAOUT<0>-MAOUT<3>. Each of the data DIN<0>. . . DIN<3> has 8 bytes, and, similarly, each of the data MAOUT<0>. . . MAOUT<3> has 8 bytes.

Between an input path 20 of write data WD and the write amplifier 17W, a serial-parallel converter circuit 21 is disposed. Although the invention is not so limited, the write data WD is supplied in parallel by 8 bytes. The serial-parallel converter circuit 21 includes four write registers 22 and a data latch control circuit 23. The input terminals of the write registers 22 are commonly connected to the input path 20, and the output terminals are individually coupled to the input terminals of the write amplifying circuits of the write amplifier 17W. The data latch control circuit 23 generates a 4-bit latch control signal DINL<3:0> by decoding a 2-bit latch control data DLAT<1:0> in synchronization with the clock signal CLK to provide latch control of the corresponding write resister 22. As the latch control data DLAT<1:0> is sequentially incremented, the write data WD inputted in parallel by 8 bytes is sequentially latched into the four write registers 22 in synchronization with the clock signal CLK, and 32-byte parallel write data DIN<0>–DIN<3> are obtained on the outputs of the four write registers 22.

Between an output path 29 of the read data MUXOUT and the main amplifier 17R, a parallel-serial converter circuit 25 is provided. The parallel-serial converter circuit 25 comprises four read registers 26, an output selector 27 and a selection control circuit 28. To the input terminals of the read registers 26, the read data MAOUT<0>-MAOUT<3> are inputted, respectively, from the main amplifier 17R. The latch timings of the read registers 26 are controlled by a latch control signal PDOLTT. A latch timing provided by the latch qontrol signal PDOLTT is controlled by a later-described output control circuit 30 so as to ensure that it is later than the timing at which the read data MAOUT<0>-MAOUT<3> is determined by the data read out from the memory cells.

The selector 27 selects the output data DOUT<0>–DOUT<3> from the read registers 26 every 8 bytes in response to a selection control signal MSEL<3:0>, and outputs this data to the output path 29. The selection control circuit 28 generates the 4-bit selection control signal MSEL<3:0> by decoding the 2-bit selection control data MUXSEL<1:0> in synchronization with the clock signal CLK. As the selection control data MUXSEL<1:0> sequentially increments, the output data DOUT<0>–DOUT<3> are sequentially outputted by 8 bytes to the output path 29 in synchronization with the clock signal CLK, thereby obtaining the read data MUXOUT.

The output control circuit 30 generates the latch control signal PDOLTT according to CAS latency. Where the data read operation is performed in synchronization with the clock signal in response to the falling edge of the column address strobe signal CAS, the "CAS latency" is a delay time, which is expressed by an equivalent number of cycles of the clock signal CLK, from the timing of the next clock cycle to the timing at which the data input to the parallel-serial converter circuit 25 is determined. More specifically, when a falling edge of the column address strobe signal CAS is detected at the falling edge of the clock signal CLK, the CAS latency represents the number of cycles of the clock signal CLK between the falling edge of a clock cycle next to the falling edge that detected the fall of the column address strobe signal CAS, and the first falling edge of the clock signal CLK after the read data DOUT<0>–DOUT<3> has been determined. The data read operation from the memory cell array 10 and the read data amplifying action by the main amplifier 17R are uniquely determined according to the circuit configuration and the properties of the circuit elements. Accordingly, in order to achieve the high-speed external output of data, it is necessary to set a CAS latency that is equal to or greater than their operational delays, but closest thereto. As previously mentioned, the CAS latency is an equivalent number of cycles of the clock signal CLK, so that the actual delay time by the CAS latency would depend upon the frequency of the clock signal CLK; and, accordingly, even when the same delay time is set, if the frequency of the clock signal CLK is high, the CAS latency would be relatively large, and, if it is low, then the CAS latency would be relatively small. In the example shown in FIG. 1, the output control circuit 30 realizes a CAS latency controlling circuit capable of controlling the CAS latency by receiving an input of latency setting data FRCD<1:0>. The CAS latency is reflected in the latch timing by the latch control signal PDOLTT.

A refresh control circuit (RCC) 40 is provided for periodically refreshing the data in each of the memory cells in the memory cell array 10, and generates a plurality of internal control signals "ref" and supplies them to the internal circuits of the memory block BNK0. On the other hand, for the memory control circuit MCNT, the refresh control circuit 40 outputs a refresh period notification signal Mref0, which is activated while the memory block BNK0 is in a refresh period.

As apparent from the above description, each of the memory blocks BNK0–BNK7 receives an input of the column address strobe signal CAS, which is varied in a cycle having a multiple length of the cycle of the clock signal CLK; and, in every transition cycle of the column address signal CAS, a plurality of serial data, that have been read out from the memory cell array 10 and parallel-serial converted in synchronization with the cycles of the clock signal CLK, are outputted from the memory block. Also, parallel data which has been inputted to the memory block in synchronization with the cycles of the clock signal CLK and serial-parallel converted is written into the memory cell array 10. In this way, using the access specification in which the column address strobe signal CAS is varied once in several cycles of the clock signal CLK, an increase in the speed of the memory operation may be obtained.

The present invention has been described in detail according to the preferred embodiments, however, it should be understood that the present invention is not limited to those features specifically disclosed, and various modifications may be contemplated without departing from the principle of the invention.

For example, the semiconductor integrated circuit of the present invention is not limited to a configuration having both higher-level and lower-level interface blocks. The present invention may be viewed and implemented in various separate configurations, such as a configuration comprising memory blocks and read buffers, such as the one shown in FIG. 11, a configuration comprising memory blocks and write buffers, such as the one shown in FIG. 12, or a configuration comprising memory blocks, read buffers and write buffers, such as the one shown in FIG. 13.

Furthermore, if the chip space allows, a read buffer and a write buffer may be provided for each of the memory blocks.

The number of memory blocks, the number of input/output bits of the parallel data, and the number of read register and write register stages may also be varied accordingly.

The memory block is not limited to a DRAM, and the read buffer and the write buffer are not limited to an SRAM. They may be memories of different types. It is obvious that the present invention is widely applicable to any cache memory, main memory and other logic-mounted semiconductor integrated circuits located in any hierarchical level.

The effects obtained by the representative implementation of the present invention among those disclosed herein are as follows.

That is, with the configuration using data buffers in order to avoid the data competition caused by the parallel operation of the memory blocks, the throughput of read operations may be improved.

The improved throughput of read operations may be achieved without meaninglessly expanding the logic scale of the logic circuits.

A semiconductor integrated circuit may be realized, which can readily accept write access requests regardless of its internal memory operation states.

What is claimed is:

1. A semiconductor integrated circuit comprising:
   a semiconductor chip;
   a plurality of memory banks formed on said semiconductor chip, each comprising a data input section, each of said plurality of memory banks including a plurality of memory cells requiring periodical refreshing of stored data;
   a plurality of write buffer circuits formed on said semiconductor chip, each of said plurality of write buffer circuits being coupled to corresponding data Input sections of corresponding ones of said plurality of memory banks, respectively;
   an external input circuit formed on said semiconductor chip, said external input circuit being coupled to said plurality of write buffer circuits and being supplied with data to be written to the corresponding memory banks; and
   a control circuit formed on said semiconductor chip to control at least a selected one of the write buffer circuits so as to have the selected write buffer circuit selectively hold data supplied to said external input circuit during a refresh action and/or read operation of the corresponding memory bank,
   wherein said control circuit controls the selected corresponding write buffer to supply said data to be written to the corresponding memory bank after said refresh action and/or said read operation to the corresponding memory bank are completed.

2. A semiconductor integrated circuit according to claim 1,
   wherein said plurality of memory banks each includes a plurality of ward lines, a plurality of data lines and said plurality of memory cells coupled to said plurality of word lines and said plurality of data lines so that each of said memory cells is coupled to one of the word lines and one of the data lines, and each of said memory cells comprises a capacitance element and a selection transistor, said selection transistor Including a selection terminal coupled to a corresponding word line and a data input/output terminal coupled to a corresponding data line.

3. A semiconductor integrated circuit according to claim 2,
   wherein said plurality of write buffer circuits each comprises:
      a memory array including a plurality of static memory cells, a plurality of word lines and a plurality of complementary data line pairs;
      an address decoder to select a given word line in response to an address signal;
      a sense amplifier to amplify the data from a plurality of selected memory cells; and
      a data output circuit to output the amplified data.

4. A semiconductor integrated circuit according to claim 3,
   wherein said plurality of static memory cells each includes a pair of inverters having their input/output terminals cross coupled.

5. A semiconductor integrated circuit comprising:
   a semiconductor chip;
   a plurality of memory banks formed on said semiconductor chip, each comprising a data Input section, each of said plurality of memory banks including a plurality of memory cells requiring periodical refreshing of stored data;
   a plurality of write buffer circuits formed on said semiconductor chip, each of said plurality of write buffer circuits being coupled to corresponding data input sections of corresponding ones of said plurality of memory banks, respectively, an external input circuit formed on said semiconductor chip, said external input circuit being coupled to said plurality of write buffer circuits and being supplied with data to be written to the corresponding memory banks, and means for controlling at least a selected one of the write buffer circuits so as to have the selected write buffer circuit selectively hold data supplied to said external input circuit during a refresh action and/or read operation of the corresponding memory bank and for supplying said data to be written to the corresponding memory bank after said refresh action and/or said read operation to the corresponding memory bank are completed.

* * * * *